United States Patent
Ginetti

(10) Patent No.: US 10,073,942 B1
(45) Date of Patent: Sep. 11, 2018

(54) METHODS, SYSTEMS, AND COMPUTER PROGRAM PRODUCT FOR IMPLEMENTING SYNCHRONOUS CLONES FOR AN ELECTRONIC DESIGN

(71) Applicant: Cadence Design Systems, Inc., San Jose, CA (US)

(72) Inventor: Arnold Ginetti, Antibes (FR)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 15/282,778

(22) Filed: Sep. 30, 2016

(51) Int. Cl.
 *G06F 17/50* (2006.01)

(52) U.S. Cl.
 CPC ...... *G06F 17/5072* (2013.01); *G06F 17/5081* (2013.01)

(58) Field of Classification Search
 CPC .................................................. G06F 17/5045
 USPC ................................................. 716/100, 119
 See application file for complete search history.

(56) References Cited

U.S. PATENT DOCUMENTS

| 6,256,768 | B1 | 7/2001 | Igusa | |
|---|---|---|---|---|
| 7,062,475 | B1 | 6/2006 | Szabo | |
| 7,117,473 | B1 | 10/2006 | Knol | |
| 7,120,892 | B1 | 10/2006 | Knol | |
| 7,469,255 | B2 | 12/2008 | Kusterer | |
| 7,555,739 | B1 * | 6/2009 | Ginetti et al. | ...... G06F 17/5045 716/107 |
| 7,710,420 | B2 | 5/2010 | Nonclercq | |
| 7,810,064 | B2 | 10/2010 | Ladin | |
| 7,921,096 | B2 | 4/2011 | Allen | |
| 8,438,530 | B2 | 5/2013 | Giffel | |
| 8,527,890 | B2 | 9/2013 | Harada | |
| 8,595,237 | B1 | 11/2013 | Chaudhary | |
| 9,208,273 | B1 * | 12/2015 | Morlat et al. | ......... G06F 17/505 |
| 2003/0101331 | A1 | 5/2003 | Boylan | |
| 2004/0083210 | A1 | 4/2004 | Ochiai | |
| 2005/0091627 | A1 | 4/2005 | Satapathy | |
| 2005/0138591 | A1 | 6/2005 | Shirai | |
| 2006/0218156 | A1 | 9/2006 | Schechinger | |
| 2008/0172638 | A1 * | 7/2008 | Gray et al. | .......... G06F 17/5045 716/122 |
| 2009/0199143 | A1 | 8/2009 | Schlotman | |
| 2011/0107281 | A1 | 5/2011 | Sun | |
| 2011/0191303 | A1 | 8/2011 | Kaufman | |
| 2013/0187941 | A1 | 7/2013 | Noon | |
| 2014/0177940 | A1 | 6/2014 | Nakagaki | |
| 2015/0269297 | A1 | 9/2015 | Tuan | |

(Continued)

OTHER PUBLICATIONS

Non-Final Office Action dated Mar. 26, 2018 for U.S. Appl. No. 15/283,081.

(Continued)

*Primary Examiner* — Sun Lin
(74) *Attorney, Agent, or Firm* — Vista IP Law Group, LLP

(57) ABSTRACT

Disclosed are methods, systems, and articles of manufacture for implementing clones for an electronic design. These methods and systems identify a schematic design of an electronic design and a set of cloning rules, configurations, or settings for implementing clones for the electronic design. These methods and systems then generate a plurality of synchronous clones in a layout of the electronic design based in part or in whole upon the set of cloning rules, configurations, or settings, without parsing the electronic design or a portion thereof.

20 Claims, 13 Drawing Sheets

(56) References Cited

U.S. PATENT DOCUMENTS

2015/0363478 A1    12/2015  Haynes
2017/0235848 A1    8/2017   Van Dusen

OTHER PUBLICATIONS

Notice of Allowance dated Apr. 16, 2018 for U.S. Appl. No. 15/283,089.
Notice of Allowance dated Apr. 23, 2018 for U.S. Appl. No. 15/282,739.
Final Office Action dated May 30, 2018 for U.S. Appl. No. 15/199,903.
Non-Final Office Action dated Jun. 15, 2018 for U.S. Appl. No. 15/283,042.
NA9109385, "Design Extensions to Contents View", IBM Technical Disclosure Bulletin, Sep. 1991, vol. 34, No. 4A, pp. 385-388 (4 pages).

* cited by examiner

METHODS, SYSTEMS, AND COMPUTER PROGRAM PRODUCT FOR IMPLEMENTING SYNCHRONOUS CLONES FOR AN ELECTRONIC DESIGN

CROSS REFERENCE TO RELATED U.S. PATENT APPLICATIONS

This Application is related to U.S. patent application Ser. No. 15/199,903 entitled "METHODS, SYSTEMS, AND COMPUTER PROGRAM PRODUCT FOR IMPLEMENTING AN ELECTRONIC DESIGN BY MANIPULATING A HIERARCHICAL STRUCTURE OF THE ELECTRONIC DESIGN" and filed on Jun. 30, 2016, U.S. patent application Ser. No. 15/282,739 entitled "METHODS, SYSTEMS, AND COMPUTER PROGRAM PRODUCT FOR IMPLEMENTING ENGINEERING CHANGE ORDERS WITH FIGURE GROUPS AND VIRTUAL HIERARCHIES", U.S. patent application Ser. No. 15/283,052 entitled "METHODS, SYSTEMS, AND COMPUTER PROGRAM PRODUCT FOR IMPLEMENTING LEGAL ROUTING TRACKS ACROSS VIRTUAL HIERARCHIES AND LEGAL PLACEMENT PATTERNS", U.S. patent application Ser. No. 15/283,089 entitled "METHODS, SYSTEMS, AND COMPUTER PROGRAM PRODUCT FOR IMPLEMENTING A FLOORPLAN WITH VIRTUAL HIERARCHIES AND FIGURE GROUPS FOR AN ELECTRONIC DESIGN", U.S. patent application Ser. No. 15/283,042 entitled "METHODS, SYSTEMS, AND COMPUTER PROGRAM PRODUCT FOR DYNAMICALLY ABSTRACTING VIRTUAL HIERARCHIES FOR AN ELECTRONIC DESIGN", and U.S. patent application Ser. No. 15/283,081 entitled "METHODS, SYSTEMS, AND COMPUTER PROGRAM PRODUCT FOR IMPLEMENTING DYNAMIC MANEUVERS WITHIN VIRTUAL HIERARCHIES OF AN ELECTRONIC DESIGN". The contents of the aforementioned U.S. patent applications are hereby expressly incorporated by reference for all purposes.

BACKGROUND

Modern electronic designs often include various cells such as some off-the-shelf configurable or non-configurable library cells, intellectual property (IP) cells, macro cells, etc. Each of these cells may be instantiated multiple times as instances in an electronic design so that when a designer desires or requires to make a change to this cell, the designer only needs to make the change once, and all the change will be automatically reflected in all the instances in the electronic design to save development efforts and to expedite the design cycles so as to shorten the time-to-market of the eventual products.

Conventional electronic design implementations include a top-down and a bottom-up approach. A top-down approach begins the implementation process at the top or highest hierarchy and proceeds to lower hierarchies until it reaches the lowest hierarchy to complete an IC design. With the top-down approach, the functional cells at a higher hierarchy may be brought into the layout canvas while each cell include its own pins, ports, or terminals (collectively pin for singular or pins for plural hereinafter). The details of these functional cells at lower hierarchies are not yet exposed and will be designed at respective lower hierarchies as the top-down approach migrates to lower hierarchies. As a result of the non-exposure or unavailability of lower hierarchies (e.g., the lower hierarchies have not yet been implemented), a circuit designer working on a higher hierarchy may need to estimate the size of each cell and guess or guesstimate the locations of pins or terminals for the cell. The estimated cell may be too big to waste invaluable space on silicon or may be too small to accommodate all the devices therein.

In addition to the manual efforts to create the location, identification, etc. for a pin of a cell, these guesstimated pin or terminal locations unlikely to be optimal for connecting with the pins or ports of the devices within the cell. Either way, multiple iterations may be required for even a single cell. In addition, even if the circuit designer knows how these pins are connected to each other, the circuit designer may only align or offset these pins by manipulating the cell. In the event that a designer groups a set of components or cells and intends to create a logical cell for the set, the pins of the logical cell or their identifications thereof (e.g., names of the pins) have to be manually created. The designer will then have to find the corresponding pin identifications in the schematic design and associated these manually created identifications with the corresponding pin identifications.

Bottom-up approaches begin with the design of discrete circuit components and proceed to higher hierarchies as the designs of lower hierarchies are complete until the design for the top or highest hierarchy is complete. In these bottom-up approaches, pins and their identifications as well as locations are determined at lower hierarchies in their respective cells. At the higher hierarchies, these pins often present a challenge to routing these pins of an actual or virtual cell because these pins are determined individually for each cell and independent of each other and may thus cause misalignment of pins or terminals at higher hierarchies where these cells are assembled and supposed to be interconnected. To rectify these problems such as pin or terminal misalignment at higher hierarchies, the design process must return to the lower hierarchies where the devices with the misaligned pins are placed, adjust the placement of the devices, and determine whether the pins or terminals are aligned at the next higher hierarchy. These conventional approaches must then proceed to the next higher hierarchy to determine whether there exist other misalignment problems. These conventional approaches may thus iterate multiple times until an acceptable or desirable solution is found. Therefore, there is a need for a better approach to manipulate the hierarchies of an electronic design to effectively and efficiently create a cell for a group of devices.

The problem is exacerbated during the prototyping, floor-planning, placement stage or during the implementation of a portion of an electronic design where no existing IP cells or blocks are available. For example, a designer may be implementing a portion of the design corresponding to a new design for which no existing cells or blocks are available. As another example, a designer may then need to lay out this portion by placing individual components. The design may then need to create one or more cells or blocks for these newly inserted layout components either because of a design requirement or because of a desire or need for reducing the complexity in the appearance of the layout. In these embodiments, the designer may first place a plurality of layout components in a layout and attempt to create one or more cells for the plurality of layout components.

Moreover, many of these layout components may need to be moved or modified to fit various design requirements during these stages. Some conventional approaches group the selected layout components into a cell but do not add any connectivity to such a cell. For example, a cell created by these conventional approaches may have no ports, pins, or terminals to connect to the remaining portion of the electronic design to which this newly created cell belongs. Some conventional approaches attempt to rectify this shortcoming by requiring manual creation of the boundary as well as manual determination of various connections (e.g., pins, terminals, ports, etc.) along the manually created boundary. These conventional approaches invariably involve some guesstimates and hence a number of iterations to finally create the cell with usable connections along the boundary of the cell.

To address some of the aforementioned issues, some conventional approaches employ cloning techniques that receive a source circuit component design (e.g., a cell in a layout) and parse through all the other circuit component designs and examine the topologies of the other circuit component designs to find target circuit component designs that have the same topologies as that of the source circuit component design. These cloning techniques may then create synchronous clones or simply clones for the source circuit component design and one or more other target circuit components having the same topology as the source circuit component design. Nonetheless, these conventional cloning techniques require a lot of computational resources such as runtime, memory footprint, etc. because these cloning techniques literally parse through the entire electronic design of interest, examine all the circuit component designs except for the source circuit component design, and determine whether any of the circuit component designs may be considered as clones of the source circuit component designs.

Therefore, there exists a need for methods, systems, and computer program products for implementing clones for an electronic design.

SUMMARY

Disclosed are method(s), system(s), and article(s) of manufacture for implementing clones for an electronic design in one or more embodiments. Some embodiments are directed at a method for implementing clones for an electronic design. In these embodiments, these described techniques identify a schematic design of an electronic design and a set of cloning rules, configurations, or settings for implementing clones for the electronic design. These techniques then generate a plurality of synchronous clones in a layout of the electronic design based in part or in whole upon the set of cloning rules, configurations, or settings, without parsing the electronic design or a portion thereof.

Some embodiments are directed at a hardware system that may be invoked to perform any of the methods, processes, or sub-processes disclosed herein. The hardware system may include at least one processor or at least one processor core, which executes one or more threads of execution to perform any of the methods, processes, or sub-processes disclosed herein in some embodiments. The hardware system may further include one or more forms of non-transitory machine-readable storage media or devices to temporarily or persistently store various types of data or information. Some exemplary modules or components of the hardware system may be found in the System Architecture Overview section below.

Some embodiments are directed at an article of manufacture that includes a non-transitory machine-accessible storage medium having stored thereupon a sequence of instructions which, when executed by at least one processor or at least one processor core, causes the at least one processor or the at least one processor core to perform any of the methods, processes, or sub-processes disclosed herein. Some exemplary forms of the non-transitory machine-readable storage media may also be found in the System Architecture Overview section below.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Figure 1:
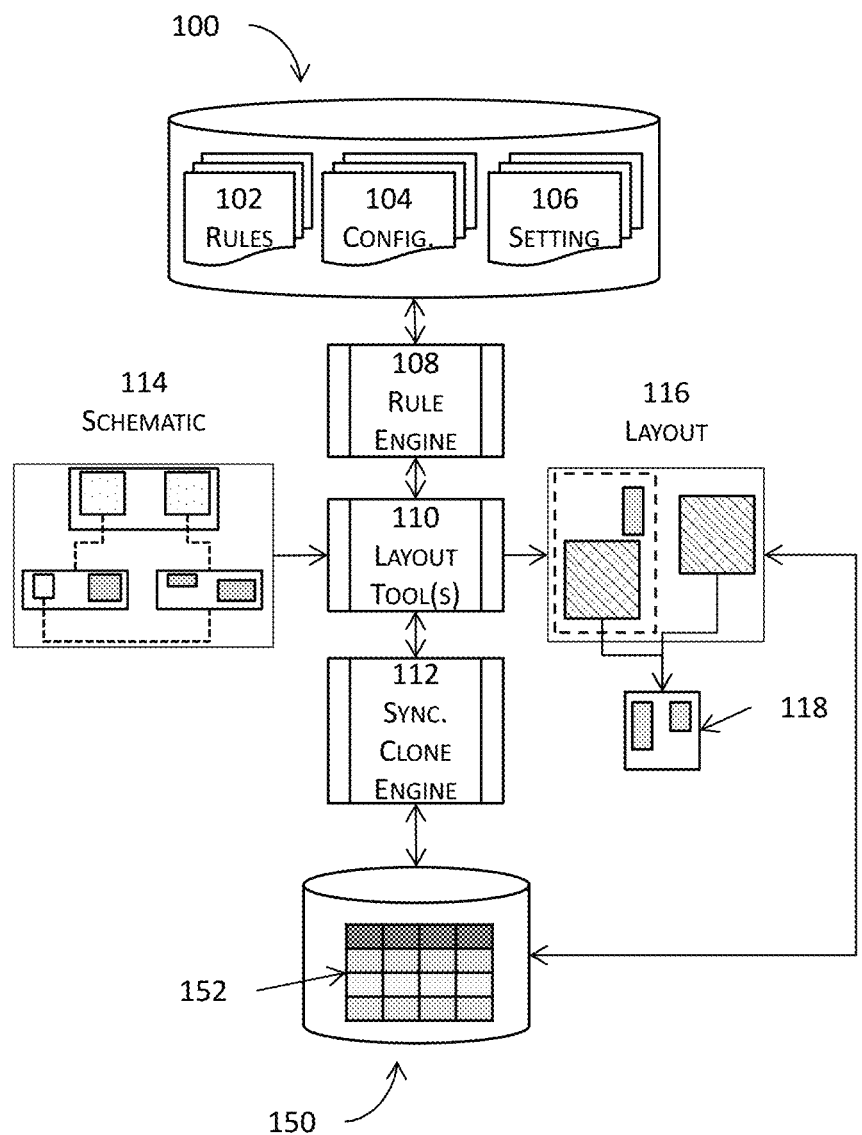
FIG. 1 illustrates a high level block diagram of a simplified system for implementing clones for an electronic design in one or more embodiments.

Various techniques are directed to implementing clones for an electronic design of an electronic design in various embodiments. These techniques identify a schematic design of an electronic design. The corresponding layout of the electronic design may be generated by, for example, identify a schematic cell or block in the schematic design and instantiate one or more instances of the schematic cell or block in their respective locations in the layout. The correspondence between a schematic cell or block and its corresponding layout instances may be tracked either by associating references to or identifications of these layout instances with the schematic cell or block. Once all the cells or blocks in the schematic design have been instantiated in the layout (for example, a placement layout, a routed layout, etc.), these techniques may create a new synchronous clone for multiple occurrences of instances of a schematic cell or block when these multiple occurrences of instances have the identical topology and one or more hierarchical parameter values.

In some embodiments where a flat layout has been created, these techniques may either identify a schematic master or an instance thereof and identify all the layout instances instantiated from or bound to the schematic master or the instance thereof. These techniques may then determine whether the layout instances are clones based on one or more criteria. These one or more criteria may include, for example, whether these layout instances have the same topology, whether these layout instances have one or more common hierarchical parameter values, or whether these layout instances have the same topology and have one or more common hierarchical parameter values.

In some of these embodiments where two instances may have one common hierarchical parameter but different hierarchical parameter values. These techniques may further optionally determine whether the common hierarchical parameter may be relaxed so that the discrepancies in the hierarchical parameter values may be ignored in order to categorize these two instances as clones. These techniques may proceed to identify the next schematic master or an instance thereof and repeat the same processes to determine whether the flat layout includes clones corresponding to this next schematic master or the instance thereof until all the schematic masters or instances thereof have been similarly or identically processed.

With clones identified, any modifications made to a clone will be automatically populated into the remaining clones. In addition, the information about a synchronous clone group having multiple clones in a layout may be stored with a clone identification in a data structure. The identifications or references of layout instances that are clones of each other (and hence belong to this synchronous clone group) may also be stored in the data structure. In some embodiments, information about the schematic instance or schematic master cell bound to these multiple instances of layout devices may also be stored in the data structure.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

FIG. 1 illustrates a high level block diagram of a simplified system for implementing clones for an electronic design in one or more embodiments. In these embodiments, one or more layout tools 110 (e.g., a layout editor) may be coupled with a clone engine 112. These one or more layout tools 110 may be further coupled to a rule engine 108 that accesses a set of rules 102, a set of configurations 104, and/or a set of settings 106 stored in a persistent or transient non-transitory computer readable storage medium 100 to determine whether clones are to be created and to create clones based in part or in whole upon the applications of the set of rules, configurations, and/or settings.

In operation, the one or more layout tools 110 may reference a schematic design 114 of an electronic design (e.g., an IC design), identify schematic master cells or instances thereof from the schematic design 114, invoke the rule engine 108 to apply a set of rules (102), configurations (104), and/or settings (106), and invoke the clone engine 112 to determine and create clones in the layout 116. The one or more layout tools 110 may also create figure groups for each group of clones while a figure group located on a virtual hierarchy may be optionally detached (and hence a new physical hierarchical will be created) as a physical cell 118, and the virtual hierarchy will be materialized into a physical hierarchical (and hence alters the physical hierarchical structure of the layout 116). Information about the clones in the layout 116, their corresponding schematic master cells or instances thereof in the schematic design 114, and other pertinent information may then be maintained at a data structure 152 on a persistent or transient non-transitory computer readable storage medium 150.

Figure 2:
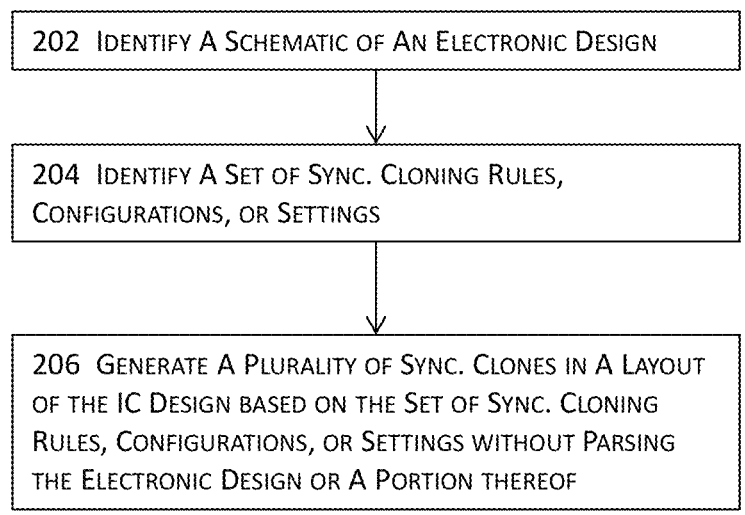
FIG. 2 illustrates a high level block diagram for implementing clones for an electronic design in one or more embodiments.

FIG. 2 illustrates a high level block diagram for implementing clones for an electronic design in one or more embodiments. In these embodiments, a schematic design of an electronic design may be identified at 202. The schematic design may include a plurality of schematic instances of one or more schematic master cells.

A set of cloning rules, configurations, or settings may be identified at 204. This set of cloning rules, configurations, or settings may be used to determine whether two layout instances are to be considered as clones of each other. Cloning rules, configurations, or settings may include, for example, whether the topologies of two layout instances are identical, whether a common hierarchical parameter has the same hierarchical parameter value for the two layout instances, whether the topologies of two layout instances are identical and whether a common hierarchical parameter has the same hierarchical parameter value for the two layout instances, etc.

Hierarchical parameters may affect how a layout instance is instantiated in a layout and may be included or associated with the layout instance or a parent thereof. Examples of hierarchical parameters include a spacing parameter between two immediately adjacent devices in the first instance, a size parameter for a layout device, a multiplication parameter for implementing multiple instances of the same layout devices and interconnecting these multiple instances, any other suitable parameters that may affect arrangements, interconnections, or numbers of one or more layout devices, etc.

With the set of rules, settings, and/or configurations, a plurality of clones may be identified or created in a layout at 206 based in part or in whole upon the set of rules, settings, and/or configurations. One of the advantages of these techniques described herein is that, unlike conventional cloning techniques, these techniques do not require receiving a cloning source device, parsing the layout, examining a plurality of layout devices to determine whether the plurality of layout devices match the cloning source device. Rather, these techniques may leverage the binding between a schematic master cell or an instance thereof and layout devices, determining whether the layout devices, without having a source or root device, can be considered as clones based in part or in whole upon the application of a set of rules, configurations, or settings. Therefore, these techniques conserve much computational resources including runtime and memory footprint because of the much fewer number of layout instances to process.

Figure 3A:
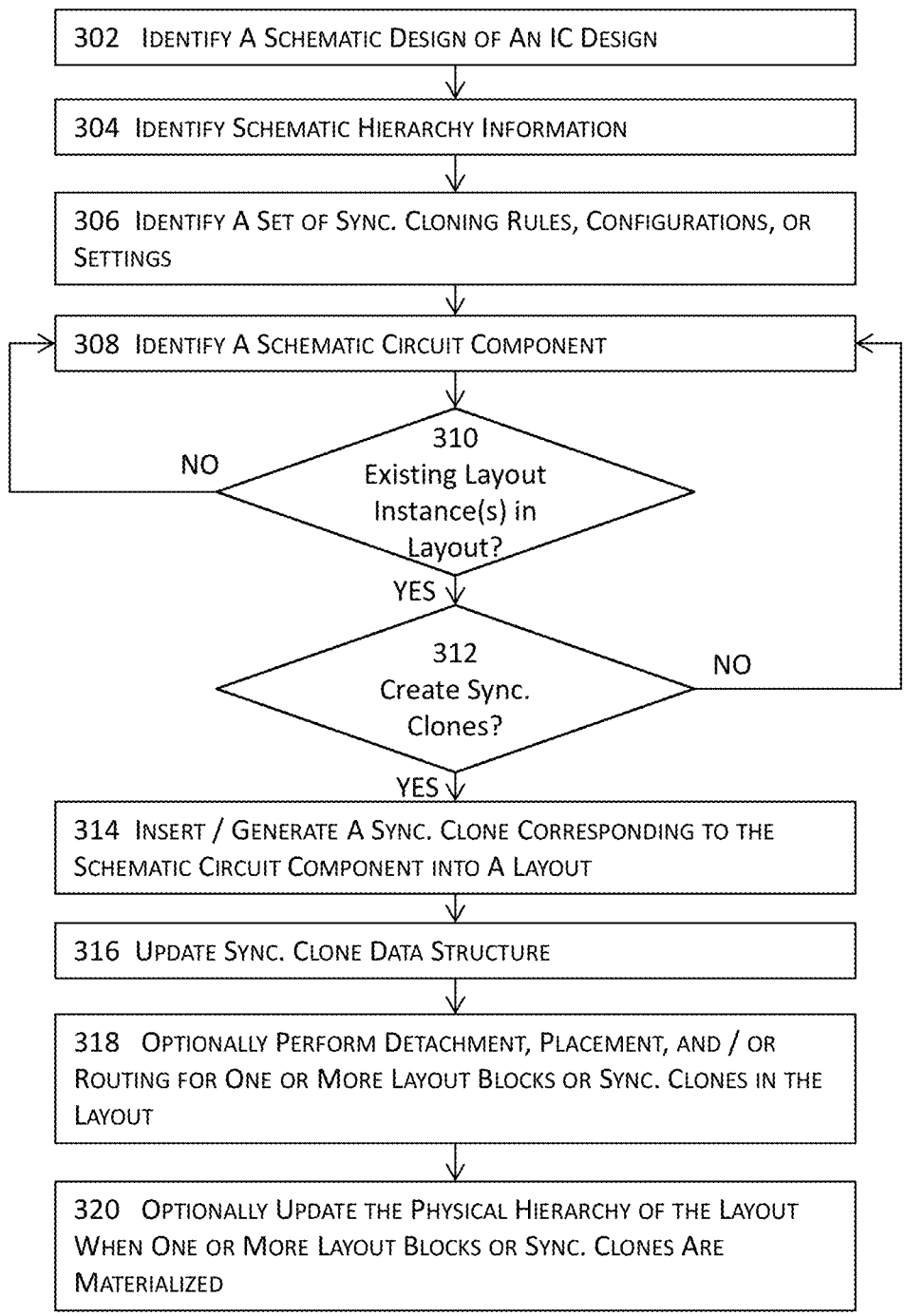
FIG. 3A illustrates a more detailed block diagram for implementing clones for an electronic design in one or more embodiments.

FIG. 3A illustrates a more detailed block diagram for implementing clones for an electronic design in one or more embodiments. In these embodiments, a schematic design or a portion thereof may be identified at 302 for an electronic design (e.g., an IC design). The schematic design includes a plurality of schematic instances or schematic components (collectively schematic component for singular or schematic components for plural) instantiated from one or more schematic master cells or blocks. The plurality of schematic instances may be referenced during the generation of the corresponding layout or a layout portion thereof and bound to the corresponding layout instances. This binding between schematic instances or the one or more schematic master cells or blocks and the corresponding layout instances may be stored in a data structure. In addition, the connectivity information delineating how the plurality of schematic instances are interconnected may also be stored in the same data structure or in a separate data structure together with the information about the interconnections (e.g., the identifications of pins, ports, terminals, and nets, etc.)

Schematic hierarchy information including the hierarchical structure of the schematic design or the portion thereof may be identified at 304. For example, the schematic hierarchies or hierarchical levels may be identified at 304. A schematic circuit component such as an instance of a schematic master cell may be identified at 308. A decision may be made at 310 to determine whether the layout includes one or more existing layout instances. In some embodiments, the layout or the portion thereof corresponding to the schematic design identified at 302 includes a flat layout or a flat layout portion where every layout circuit component design is inserted on the same hierarchical level. In these embodiments, the flat layout may be considered as a hierarchical layout having only one physical hierarchy.

If the decision result at 310 is negative, the layout instance may be created in the layout. Because this layout instance is the first and only instance corresponding to the identified schematic circuit component, there is no need to determine whether clones are to be created. On the other hand, if the decision result at 310 is affirmative, a further decision may be made at 312 to determine whether clones are to be created. Clones represent layout circuit component designs having the same topology (e.g., having the same circuit component designs interconnected in an identical manner) so that when one of the clones is modified, the same modifications are automatically populated to the other clone(s). The decision at 312 may be made based in part or in whole upon a set of settings, configurations, or rules. In some embodiments, one or more rules, settings, or configurations may be relaxed and hence excluded from the decision at 312. More details about the decision at 312 will be described below with reference to FIG. 3B.

If the decision result at 312 is negative, the process may return to 308 to identify the next schematic circuit component and repeat the sub-processes described above. On the other hand, if the decision result at 312 is affirmative, a clone corresponding to the identified schematic circuit component may be inserted or generated at 314 in the layout. A clone may include a set of layout circuit component designs in some embodiments. In these embodiments where the layout is a flat layout with only one hierarchy, each layout circuit component design (e.g., a shape) may be inserted at its own location in the flat layout. A clone may include a layout instance corresponding to a layout master cell in some other embodiments. In these embodiments, an instance may be instantiated from the layout master cell at a location in the layout. In some other embodiments, a clone may include a figure group or a virtual block (collectively figure group for singular or figure groups for plural) having one or more input, output, and/or ioput pins, ports, or terminals along the boundary of the figure group. In these embodiments, an instance of the figure group may be inserted at a virtual hierarchy, instead of a physical hierarchy, in the layout.

The clone inserted or generated at 314 may correspond to a clone group data structure that includes information about all the occurrences of the clones in the same clone group in a layout. For example, a clone group data structure may include information about the schematic instance or master thereof corresponding to the clones in the same group in the layout, identifications of these clones that corresponding to different occurrences in the layout, etc. A clone group data structure may also maintain versions or histories of the clones or the group of clones. For example, the clone group data structure may include history or versioning information about the additions or deletions of occurrences (and their corresponding information), versions or histories of clones for track modifications to a clone (and hence all the other clones in the group), etc. A clone in the clone group may also include or correspond to the identification or link to the clone group or the clone group data structure.

A clone data structure may be updated at 316. This clone data structure may be a separate data structure from the clone group data structure described immediately above or may be the same clone group data structure with augmented information. One of the purposes served by the clone data structure is to link the pertinent information about the clones among the layout and the schematic so that given a clone, the corresponding schematic information and layout information may be identified with ease. For example, the information about a synchronous clone group having multiple clones in a layout may be stored with clone identification in the clone data structure. The identifications or references of layout instances that are clones of each other (and hence belong to this synchronous clone group) may also be stored in the data structure. In some embodiments, information about the schematic instance or the schematic master cell bound to these multiple occurrences of clones may also be stored in the clone data structure.

Detachment, placement, and/or routing may be optionally performed at 318 for one or more clones and/or one or more layout circuit component designs in the layout. More details about the detachment are described in U.S. patent application Ser. No. 15/199,903 entitled "METHODS, SYSTEMS, AND COMPUTER PROGRAM PRODUCT FOR IMPLEMENTING AN ELECTRONIC DESIGN BY MANIPULATING A HIERARCHICAL STRUCTURE OF THE ELECTRONIC DESIGN" and filed on Jun. 30, 2016, which is expressly incorporated by reference for all purposes in this application. It shall be noted that the terms "detach" and "materialize" (and their corresponding variants) are used interchangeably throughout this application. For example, "detach" and "materialize", "detachment" and "materialization", and "detached" and "materialized" may be used interchangeably in this application.

For placement, it shall be noted that these techniques apply with full and equal effects to design planning, floor-planning, placement, etc. Therefore, the layout populated with the clones or layout circuit component designs may or may not be a placement layout. Rather, the layout may constitute a floorplan where layout circuit component designs are inserted into the layout canvas while some or all placement design rules are ignored. As a result, a figure group may be created for a plurality of layout circuit component designs despite the fact that the plurality of layout circuit component designs are not placed according to pertinent placement design rules. In these embodiments, the placement engine may be invoked to place the layout circuit component designs in a clone represented as a figure group and/or to place one or more other layout circuit component designs in the layout at 318.

The physical hierarchy of the layout may be optionally updated at 320 when one or more figure groups or clones are materialized from virtual blocks into materialized (and hence physical) blocks. When a figure group is created in a layout, the figure group is created on a virtual or logic hierarchy, instead of a physical hierarchy, so that the physical hierarchical structure of the original layout is not disturbed. Virtual or logic hierarchies can nevertheless be manipulated in exactly the same manner as the physical hierarchies, and the difference is that virtual or logic hierarchies only exist logically without altering the physical hierarchical structure of the layout. For example, a layout may be a flat layout (e.g., a hierarchical layout having only a single physical hierarchy). Nonetheless, an unlimited number of virtual or logic hierarchies may be created for this flat layout while this layout remains flat. That is, the physical hierarchical structure of having a single hierarchical level is preserved despite the creation of virtual hierarchies in the flat layout. Virtual hierarchy information may nonetheless be used to annotate the physical hierarchy and/or the schematic hierarchy so that EDA (electronic design automation) tools know what these virtual or logic hierarchies report to and where to place the materialized hierarchy when a virtual block on a virtual hierarchy is materialized or detached as a physical block.

Figure 3B:
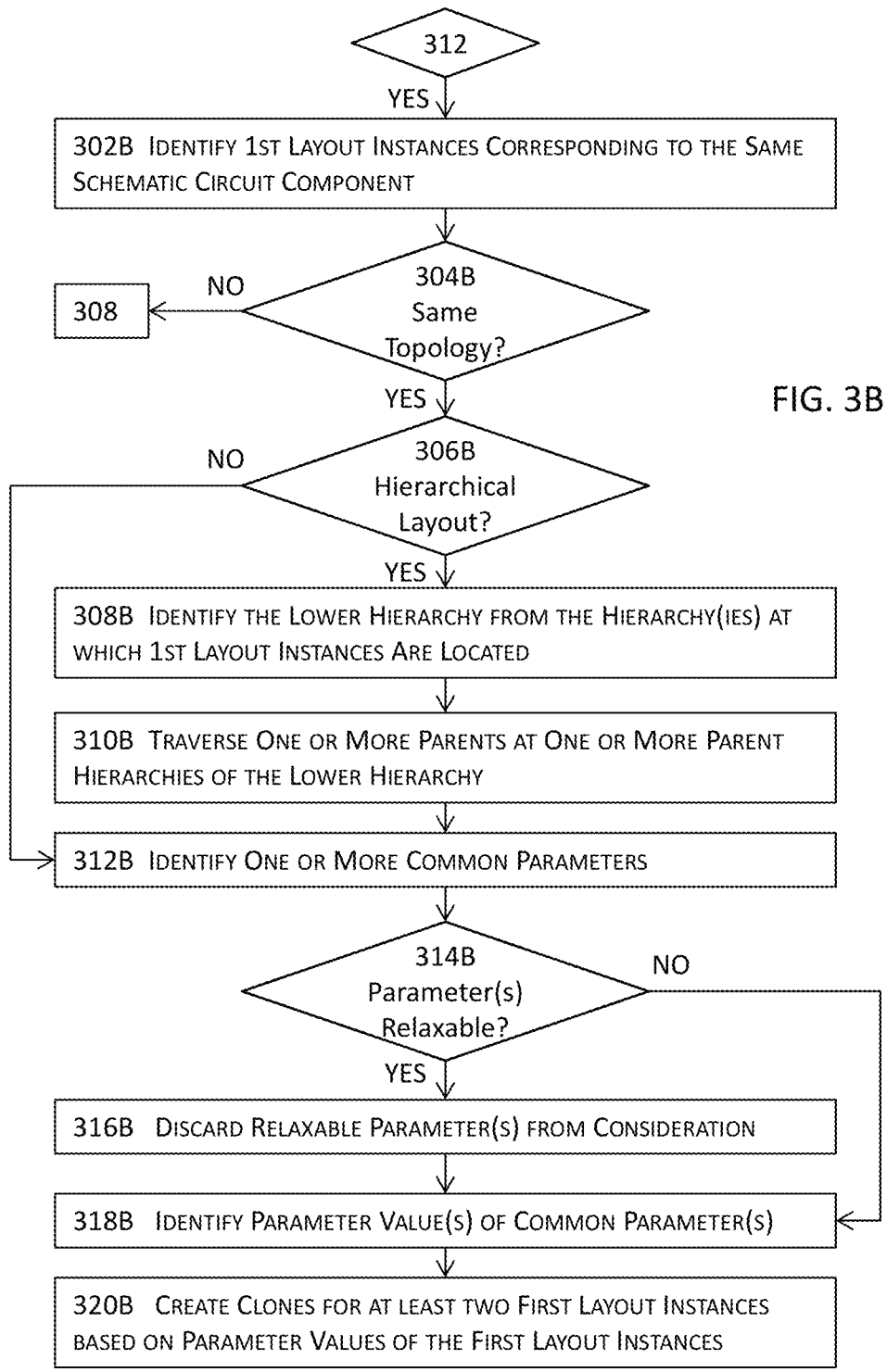
FIG. 3B illustrates more details about a sub-process for determining whether clones are to be created for an electronic design of FIG. 3A in one or more embodiments.

FIG. 3B illustrates more details about a sub-process for determining whether clones are to be created for an electronic design of FIG. 3A in one or more embodiments. In these embodiments, first layout instances corresponding to the same schematic circuit component design (e.g., a schematic instance or a schematic master cell thereof) may be identified at 302B when it is determined to create a clone at 312. The topology of the first layout instances may be compared with each other to determine whether at least two of the first instances have the same topology at 304B. For example, these techniques may determine whether two first instances have the same layout circuit components that are interconnected in an identical manner.

In some embodiments where the layout is generated from the corresponding schematic, the layout-schematic binder that binds the layout to the corresponding schematic, the layout topology of a layout instance is therefore identical to that of the corresponding schematic instance. In these embodiments where these two first instances are generated from the same schematic instance, there is no need to compare the topology of these two first layout instances because their topology corresponds to the same topology of the corresponding schematic instance. As a result, the flow diagram may skip the determination at 304B and proceed directly to 306B. In some of these embodiments where a layout is generated from the corresponding schematic design with, for example, the aforementioned layout-schematic binder, the topology of the first instances may nevertheless be compared to determine whether these first instances exhibit the same topology. In these embodiments, the topology examination or comparison may be performed on a conservative, cautionary basis similar to the layout-versus-schematic (LVS) check that checks whether the layout is equivalent to the corresponding schematic design despite the fact that the layout is generated based on the corresponding schematic design and hence should be equivalent to the schematic design.

If the determination result at 304B is negative, the process may return to 308 to identify the next schematic instance or schematic master cell for 312. All the first instances identified at 302B are discarded from further analyses because the fact that these first instances do not have the same topology indicate that no clones may be created, and that these first instances are to be maintained as separate layout instances for individual processing.

On the other hand, if the determination result at 304B is affirmative, another decision may be made at 306B to determine whether the layout is a hierarchical layout or a flat layout. If the layout is determined to be hierarchical having more than one physical hierarchy, the lower or lowest physical hierarchy from the hierarchies at which the first layout instances are located may be identified at 308B. On the other hand, if the determination result at 306B is negative, the process may skip 308B and 310B and proceed directly to 312B that is described in greater details below. In some embodiments, clones require identical topology and identical hierarchical parameter value(s) among the clones.

A clone may include one or more hierarchical parameters associated with their respective values in some embodiments. In some other embodiments, one or more parents of a clone at one or more higher hierarchies may include one or more hierarchical parameters that are inherited or passed down to the clone. Therefore, these techniques may optionally traverse one or more parents at one or more parent hierarchies of a first layout instance at a lower hierarchy at 310B to identify one or more common hierarchical parameters among the first layout instances at 312B.

If no such common hierarchical parameters can be identified among at least two first layout instances, the process may optionally proceed to 314B to determine whether one or more hierarchical parameters of the first layout instances may be relaxed and thus discarded from the determination of whether to create clones at 312. If the determination at 314B is affirmative, these one or more hierarchical parameters may then be discarded and excluded at 316B from the determination of whether to create clones.

The value(s) of one or more common parameters may then be identified at 318B while any relaxable hierarchical parameters will have been excluded from these one or more common parameters. On the other hand, if it is determined that none of the hierarchical parameters may be relaxed at 314B, all hierarchical parameters may be considered pertinent to the determination of whether to create clones. In these embodiments, the process may skip 316B and proceed directly to 318B to identify the value(s) of these pertinent one or more hierarchical parameters for each first layout instance.

It shall be noted that the determination at 314B is optional. In some other embodiments, all hierarchical parameters are considered pertinent to the determination at 312 and will thus be considered. Clones may then be created at 320B for at least two of the first instances identified at 302B. In some embodiments, clones may be created for two layout instances when these two layout instances have not only the same topology but also the same common hierarchical parameter values. In some other embodiments, one or more common hierarchical parameters may be relaxed so that clones may still be created for two layout instances in spite of the difference in values of one or more common hierarchical parameters that are deemed relaxable. In some embodiments, any layout instances for which clones have been created may be removed from the search space for the EDA tools (e.g., the synchronous clone engine 112) so that the EDA tools may search a smaller and smaller search space in creating clones to conserve computational resources.

Figure 3C:
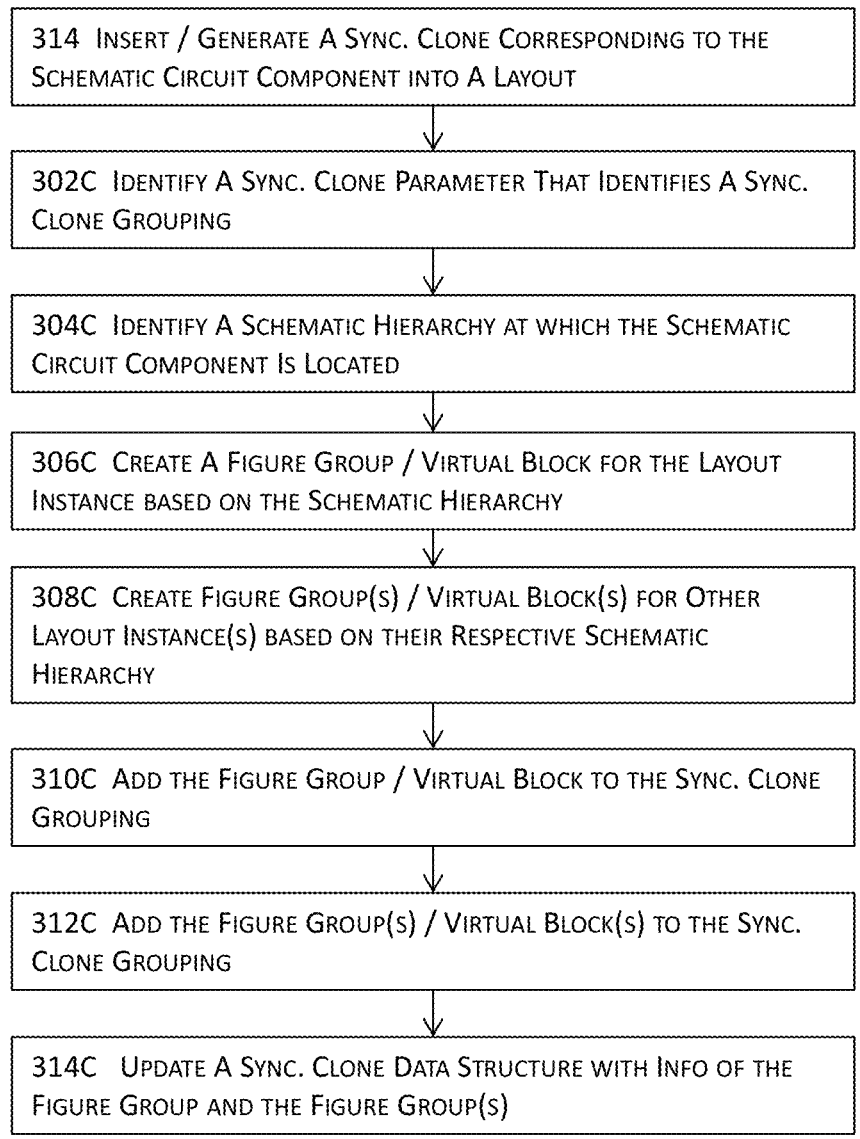
FIG. 3C illustrates more details about another sub-process for determining whether clones are to be created for an electronic design of FIG. 3A in one or more embodiments.

FIG. 3C illustrates more details about another sub-process for generating or inserting clones into a layout of an electronic design of FIG. 3A in one or more embodiments. At 302C, a synchronous clone parameter that identifies a clone grouping maybe identified at 302C. A clone grouping includes the information about all the occurrences of clones belonging to this grouping and other pertinent information including, for example, information about the schematic instance or the schematic master corresponding to the clones in this grouping, identifications of the clones in this grouping, etc. The clone grouping may thus be updated when clones are added into or removed from the grouping.

A schematic hierarchy at which the schematic circuit component identified at 308 may be identified at 304C, and a figure group may be created at 306C for the layout instance, which is identified at 310, based in part or in whole upon the schematic hierarchy. When the figure group is created at 306C, the figure group is created on a virtual hierarchical level. This virtual hierarchical level corresponds to the schematic hierarchy identified at 304C. In some embodiments, there is a one-to-one relationship between schematic hierarchies and virtual hierarchies. In some other embodiments, multiple virtual hierarchies may correspond to the same schematic hierarchy, and these multiple virtual hierarchies corresponding to the same schematic hierarchy may be subsequently consolidated into a single virtual hierarchy if required or desired.

The same schematic master cell may be bound to one or more other layout instances that are instantiated at the same hierarchical level or at different hierarchical levels. For example, a schematic cell may be instantiated at the top hierarchy of a layout and also in another module that is located at the same top hierarchy of the layout. In this example, the instance corresponding to the top hierarchy will be located at a different hierarchy than the instance corresponding to the module.

As a result, one or more additional, identical figure groups may be created at 308C for one or more other layout instances based in part or in whole upon their respective schematic hierarchical level(s). In these embodiments, one or more schematic instances that correspond to one or more other layout instances and the layout instance for which a figure group is created at 306C may be further examined to determine whether the one or more other layout instance share one or more common, non-relaxable hierarchical parameters with the layout instance. If the determination result is affirmative, a decision may be further made to determine whether these one or more common, non-relaxable hierarchical parameter values correspond to the same value. If the determination result is again affirmative, the flow diagram may proceed to 310C. Otherwise, the flow diagram may return to identify another figure group or another layout instance and repeat the flow from 302C.

It shall be noted that in some embodiments, these techniques maintain the layout as a flat layout until or unless the layout or a portion thereof is considered or proven stable and can be materialized (or detached) although one or more virtual hierarchies may still be created so that the layout retains the benefits of a flat layout and a hierarchical layout (via virtual hierarchies) at least until or unless the layout or a portion thereof is considered or proven stable and can be materialized.

At 310C, the figure group created at 306C or information thereof (e.g., identification of the figure group) may then be added to the clone grouping identified at 302C. In addition, the one or more other figure groups created at 308C may also be added to the clone grouping at 312C because these figure groups have the same topology and hierarchical parameter value(s). The clone data structure may then be updated at 314C with the information of the figure group created at 306C and the one or more other figure groups created at 308C.

Figure 3D:
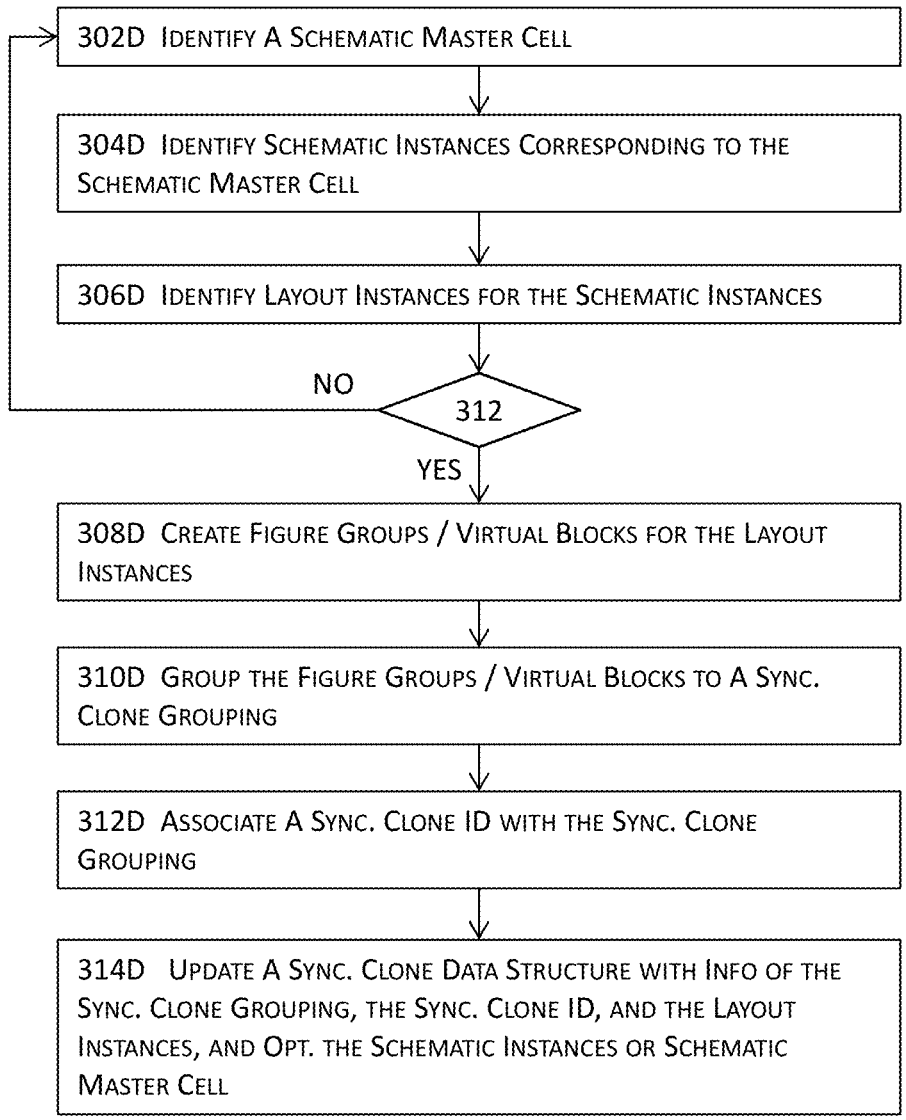
FIG. 3D illustrates another more detailed block diagram for implementing clones for an electronic design in one or more embodiments.

FIG. 3D illustrates another more detailed block diagram for implementing clones for an electronic design in one or more embodiments. These embodiments illustrate an alternative approach to create clones in a layout by generating clones for each schematic master cell having multiple instances in the schematic design and populating a layout canvas (e.g., a floorplan) with the generated clones. At 302D, a schematic master cell, rather than a schematic instance in the schematic design, is identified. Schematic instances corresponding to the same schematic master cell may be identified at 304D. A plurality of layout instances corresponding to the identified schematic instances may be identified at 306D.

The process may then proceed to the same decision block 312 described above. If the decision result at 312 is negative, the process may return to 302D to identify the next schematic master cell and repeat the sub-processes of 302D through 312. On the other hand, if the decision result at 312 is affirmative, a plurality of figure groups may be created at 308D for the plurality of layout instances identified at 306D, and the plurality of figure groups may be grouped into a synchronous clone grouping at 310D.

Information about the clones (e.g., identifications or identifiers of the plurality of clones) may be associated with or included in the synchronous clone grouping at 312D, and a clone data structure may be updated at 314D with one or more pieces of information including, for example, information about the synchronous clone grouping, the identifications of the clones, information (e.g., identifiers, etc.) about the plurality of layout instances, etc. In some embodiments, the clone data structure may also optionally include or associate with the information (e.g., instance names, master cell names, etc.) of the schematic instances or the schematic master cells.

Figure 3E:
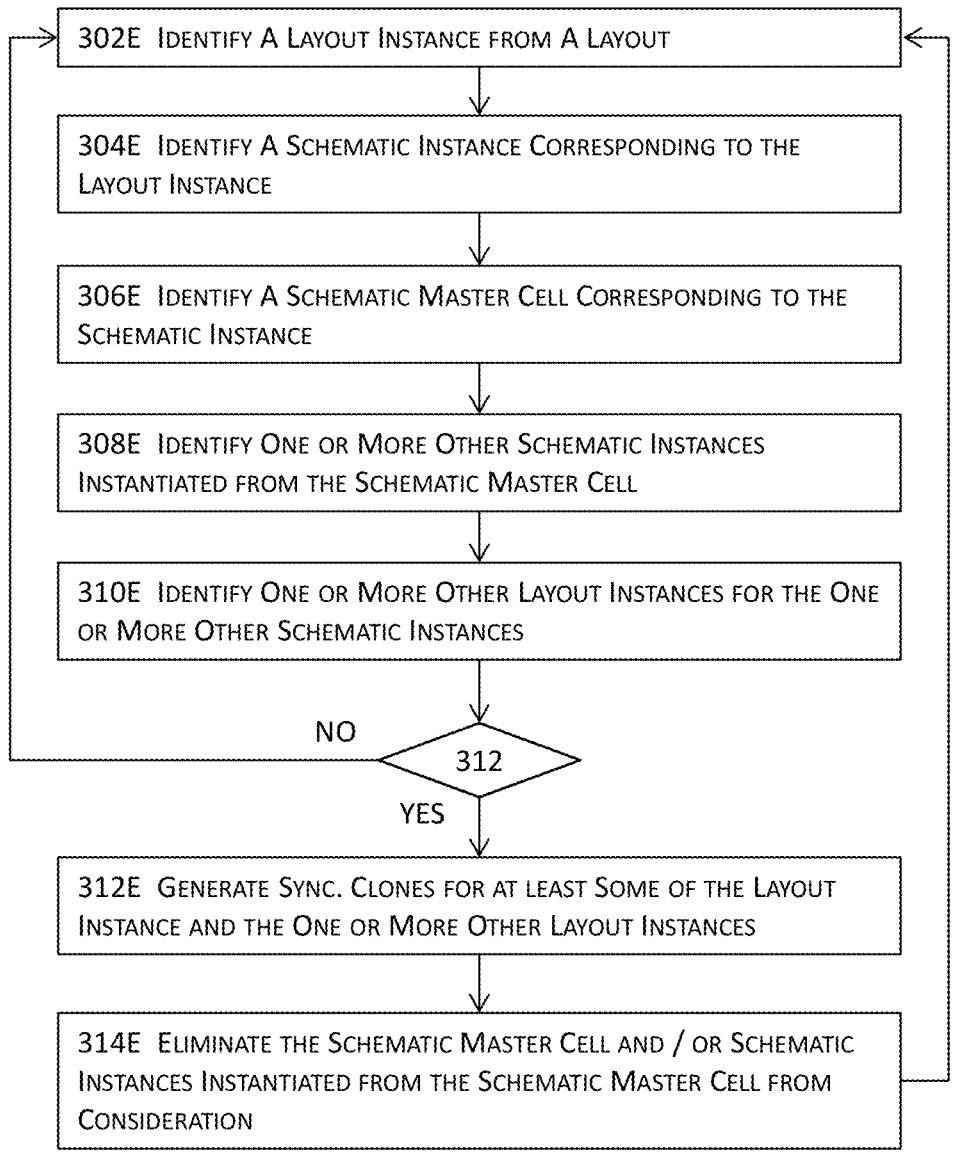
FIG. 3E illustrates another more detailed block diagram for implementing clones for an electronic design in one or more embodiments.

FIG. 3E illustrates another more detailed block diagram for implementing clones for an electronic design in one or more embodiments. FIG. 3E illustrates another cloning technique that begin with layout instances in a layout. These embodiments illustrated in FIG. 3E are especially advantageous for creating clones in a flat layout (e.g., a floorplan) that has been created. In these embodiments, a layout instance may be identified at 302E from a layout (e.g., a flat layout). The schematic instance (at 304E) or schematic master cell (at 306E) corresponding to the identified layout instance may be identified via, for example, the binding between the layout instances and corresponding schematic instances or schematic master cell(s) thereof in some embodiments. This binding enables the linking between a layout instance and the identification of the corresponding schematic instance or the identification of the schematic master cell.

In some embodiments where the schematic instance corresponding to the identified layout instance is identified at 306E, one or more other schematic instances may be identified at 308E from the schematic master cell from which the identified schematic instance is instantiated. In some other embodiments where the schematic master cell is identified at 306E, some or all of the schematic instances instantiated from this schematic master cell may be identified from the schematic design at 308E. Responsive to the identification of these schematic instances at 308E, one or more other layout instances corresponding to the identified some or all schematic instances may be identified at 310E from the layout.

The process may then proceed to 312E to determine whether clones are to be created for the layout instances identified at 302E and 310E. If the determination result is negative at 312, the process may return to 302E to identify the next layout instance that has not been identified and repeat the sub-processes of 302E through 312. On the other hand, if the determination result at 312 is affirmative, clones may be generated for at least two layout instances of the layout instances identified at 302E and 310E. The at least two layout instances for which clones are created may then be eliminated at 314E from the search space so that in subsequent determination and generation of clones, the EDA tools (e.g., the clone engine 112) only needs to search a smaller search space to conserve computational resources such as runtime and memory footprint. This process from 302E may then be repeated until all the layout instances in the layout have been similarly or identically processed.

Figure 4A:
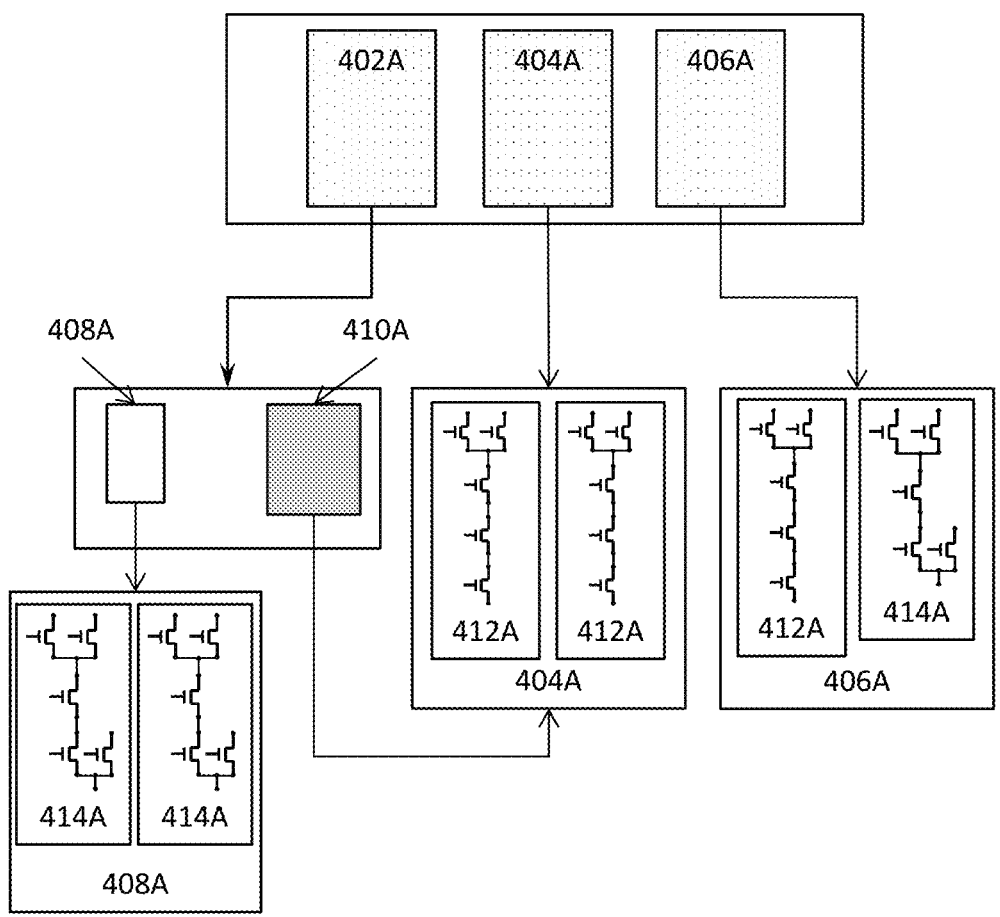
FIGS. 4A-4D illustrate some examples of the application of some techniques for clone implementation described herein to a simplified portion of an electronic design in some embodiments.

FIGS. 4A-4D illustrate some examples of the application of some techniques for clone implementation described herein to a simplified portion of an electronic design in some embodiments. In these examples, FIG. 4A illustrates an example of a schematic design or a portion thereof that includes three schematic instances 402A, 404A, and 406A located at a first schematic hierarchy. Schematic instance 402A further includes schematic instances 408A and 410A located at a second schematic hierarchy immediately below the first schematic hierarchy. Schematic instance 408A includes two schematic instances 414A located at a third schematic hierarchy immediately below the second schematic hierarchy at which schematic instances 408A and 410A are located.

Like schematic instance 404A, schematic instance 410A located at the second schematic level includes two schematic instances 412A. Nonetheless, for schematic instance 410A, these two schematic instances 412A are located at the third schematic hierarchy, whereas schematic instances 412A are located at the second schematic hierarchy for the schematic instance 404A. In other words, both the schematic instances 410A and 404A are instantiated from the same schematic master cell. Schematic instance 406A at the first schematic hierarchy includes two instances 412A located at the second schematic hierarchy. As it can be seen from FIG. 4A, schematic instances 412A and 414A have the same schematic devices, but these schematic devices are connected differently. In other words, these two schematic instances 412A and 414A have different topologies and correspond to different schematic masters.

Figure 4B:
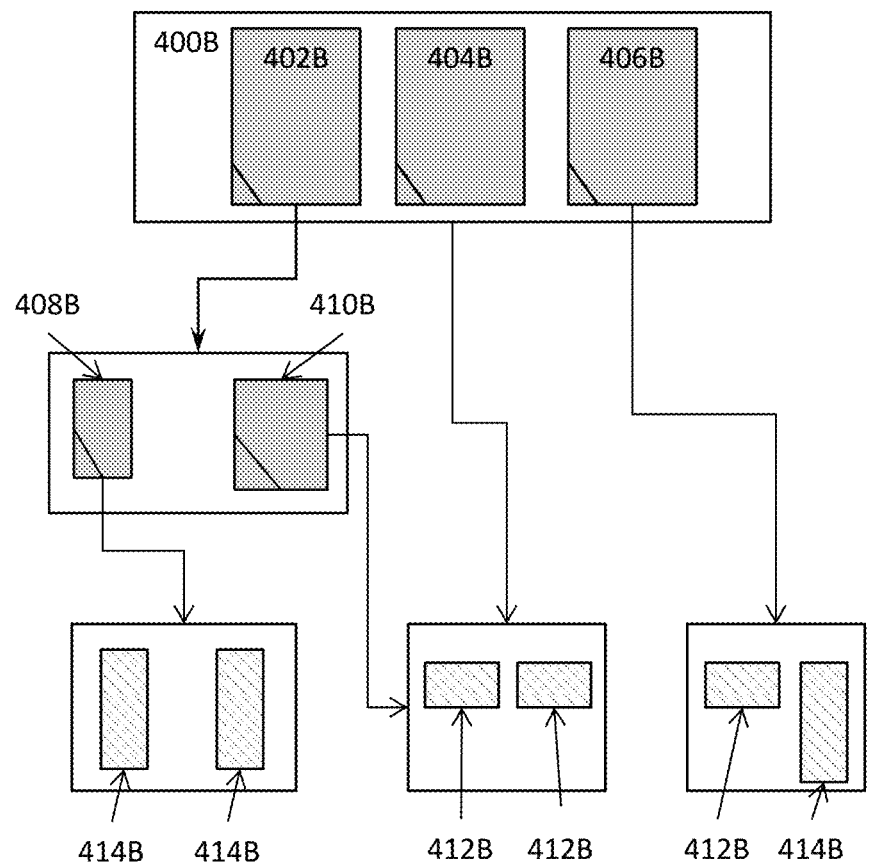

FIG. 4B illustrates an example of a layout portion that corresponds to the schematic design illustrated in FIG. 4A. In FIG. 4B, this layout portion 400B includes figure group 402B, figure group 404B, and figure group 406C located at a first hierarchy. The hierarchies illustrated in FIG. 4B may represent physical hierarchies, virtual hierarchies, or a combination of virtual and physical hierarchies. For the ease of explanation, it is assumed that the layout portion 400B is a flat layout portion having only one physical hierarchy, and the hierarchies shown in FIG. 4B are virtual or logic hierarchies. Figure group 402B includes two additional figure groups 408B and 410B that are located at a second virtual hierarchy immediately below the first virtual hierarchy at which figure groups 402B, 404B, and 406B are located. Figure group 410B in figure group 402B includes two instances of layout device 412B that corresponds to the schematic instance 412A. These two instances of layout devices 412B in figure group 410B are located at the third virtual hierarchy. Figure group 404B located at the first virtual hierarchy includes the same two layout instances 412B, although at the second virtual hierarchy.

In addition, figure group 406B includes two different layout instances 412B and 414B located at the second virtual hierarchy because figure group 406B is located at the first virtual hierarchy. Layout instance 414B corresponds to the schematic instance 414A in FIG. 4A.

In some embodiments, the three virtual hierarchies may be decorated or associated with the physical hierarchical structure to delineate the relations between the virtual hierarchies and the physical hierarchical structure. In some other embodiments where the layout portion 400B is a flat layout portion having only one physical hierarchy, these three virtual hierarchies may be used to annotate or decorate the flat hierarchy in a tree-like data structure or any other suitable data structure to indicate that the flat layout portion 400B actually includes three virtual hierarchies, and the first virtual hierarchy represents the top virtual hierarchy of the virtual or logic hierarchical structure while the layout portion 400B remains flat.

Moreover, in these examples illustrated in FIGS. 4A-D, it may be assumed that figure group 402B includes or corresponds to a hierarchical parameter (e.g., an offset parameter) having a hierarchical parameter value of "2", and figure group 404B includes or corresponds to the same hierarchical parameter but with a hierarchical parameter value of "3". It may be also assumed that this hierarchical parameter is inherited by their respective child figure groups.

Figure 4C:
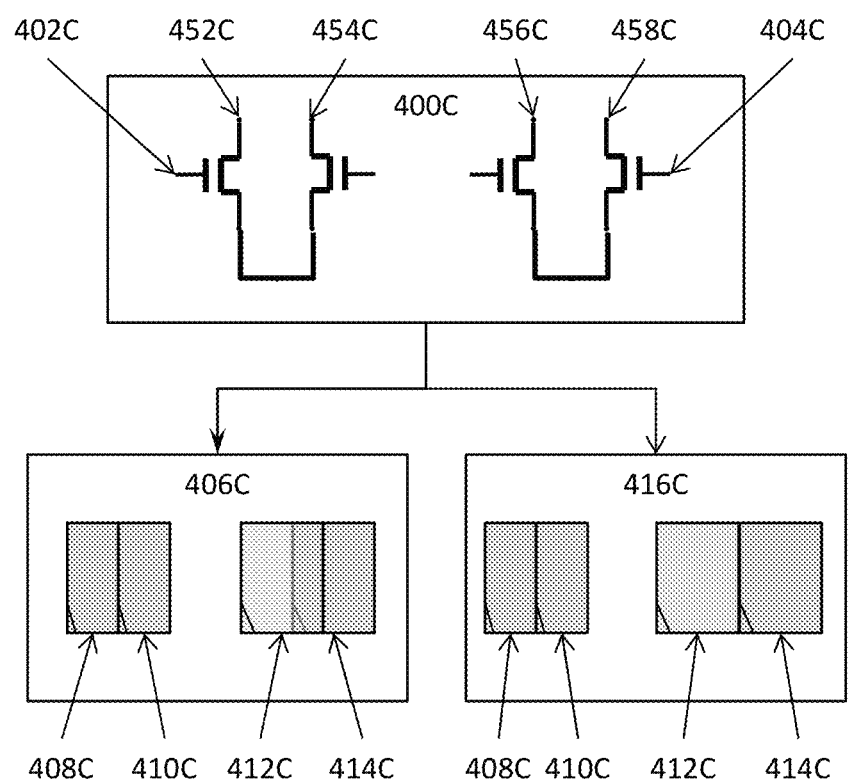

FIG. 4C illustrates an example of a schematic portion 400C including two schematic instances 402C and 404C. Schematic instance 402C includes two schematic circuit components (MOS or metal oxide semiconductor) 452C and 454C, both of which include or correspond to a hierarchical parameter having the same hierarchical parameter value of "2". These two schematic circuit components are identical topologically and correspond to the same hierarchical parameter.

The hierarchical parameter indicates the size of the layout circuit component (e.g., 408C, 410C, etc.) and hence the offset between two layout instances bound to these two schematic circuit components 452C and 454C where a larger hierarchical parameter value corresponds to a larger layout instance and hence a larger offset between these two layout instances in the layout. Schematic instance 404C includes two schematic circuit components 456C and 458C (e.g., MOS), both of which include or correspond to the same hierarchical parameter yet having a different hierarchical parameter value of "4". That is, all four schematic circuit components 452C, 454C, 456C, and 458C represent topologically identical MOS components, but 452C and 454C include or correspond to a hierarchical parameter value of "2", whereas 456C and 458C include or correspond to a hierarchical parameter value of "4".

When the layout 406C is created, a clone engine (e.g., 112 in FIG. 1) may determine that the two schematic instances 402C and 404C have the same topology because these two instances include the same circuit components interconnected in the same manner. If the aforementioned hierarchical parameter may be relaxed, clones may be created for both schematic instances 402C and 404C. Assuming layout instances 408C and 410C are first created with the hierarchical parameter value of "2" resulting in abutted layout instances 408C and 410C, another clone for layout instances 412C and 414C will result in an overlap between the two layout instances 412C and 414C because the layout tool maintains the same offset distance as indicated by the hierarchical parameter value of "2" when the clone including layout instances 408C and 410C is created. This overlap is illustrated in the layout portion 406C.

On the other hand, if the clone engine (e.g., 112 of FIG. 1) accounts for both the topology and the hierarchical parameter that is determined not to be relaxed, layout instances 408C and 410C will still be generated with the hierarchical parameter value of "2" resulting in abutted layout instances 408C and 410C. In addition, layout instances 412C and 414C will be generated with the hierarchical parameter value of "4" resulting in larger yet abutted layout instances 412C and 414C as illustrated in 416C. It shall be noted that in some embodiments (e.g., during design planning or floorplanning stages), a designer may desire to manipulate various design components in a layout canvas quickly and thus may tolerate some overlaps in layout instances as illustrated in 406C.

Figure 4D:
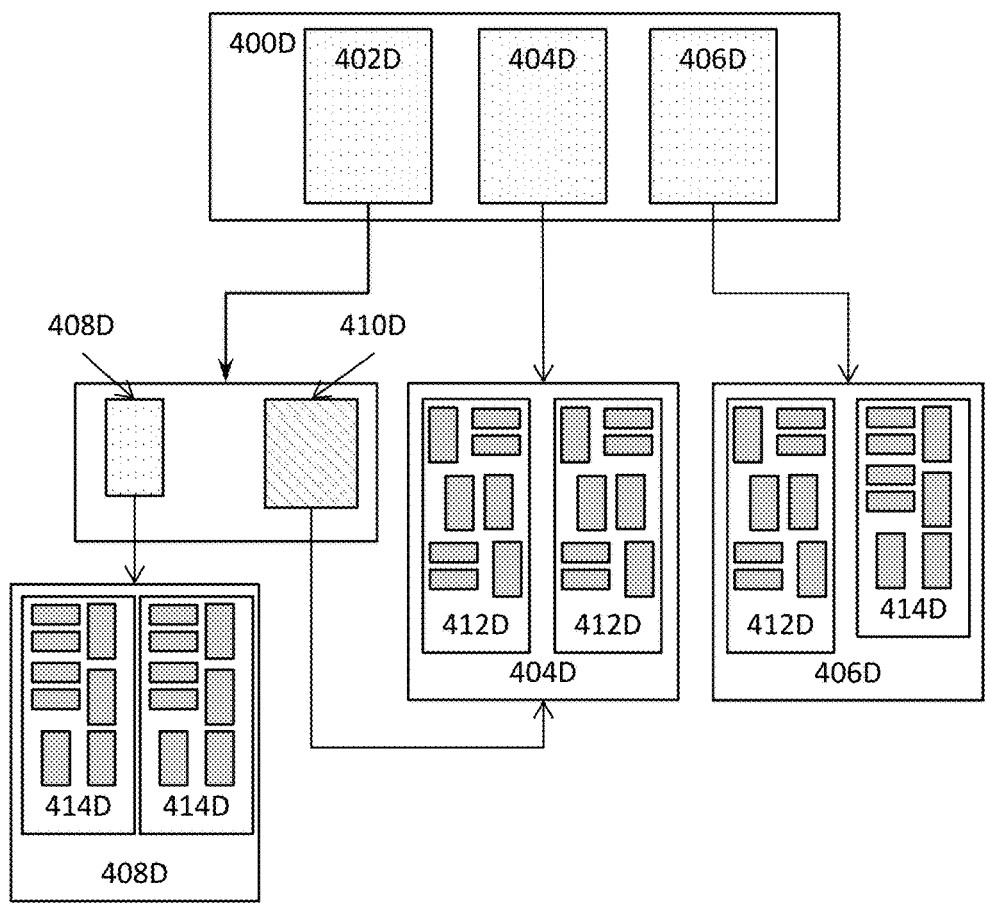

FIG. 4D illustrates an example layout portion that corresponds to the schematic portion illustrated in FIG. 4A. In some embodiments, a layout tool may function in tandem with a clone engine (e.g., 112 of FIG. 1) to create layout shapes in a flat layout 400D. It shall be noted that all the hierarchies illustrated in FIG. 4D are virtual hierarchies where the layout portion 400D remains flat. That is, FIG. 4D illustrates clone generation in a flat layout by using virtual hierarchies to demonstrate how the clones are generated, and where the clones are located in the virtual or logic hierarchical structure. It shall be further noted that the shapes illustrated in various figures in this application (e.g., FIGS. 4B-4D) are not drawn to scale, and that these shapes or figures should not be interpreted as such.

The layout tool may populate the flat layout portion 400D with layout shapes. For example, the layout tool may start by populating layout shapes (e.g., the shapes in 414D) located at a fourth virtual hierarchy and bound to schematic instances 414A into the flat layout portion 400D. The layout tool may then create two figure groups that are located at a third virtual hierarchy immediately above the fourth virtual hierarchy and respectively correspond to the two schematic instances 414A. The layout tool may further create a figure group 408D that is located at a second virtual hierarchy immediately above the third virtual hierarchy. The layout tool may also create the figure group 402D at a first virtual hierarchy immediately above the second hierarchy. The shapes in figure groups 412D may also be created. The clone engine may determine that the figure group 404D including both figure groups 412D is a clone of the figure group 410D because their topologies and common hierarchical parameter values are identical. These two figure groups 410D and 404D may thus be categorized into the same clone grouping as described above. The layout tool may also populate the shapes in 412D and 414D and optionally create figure group 412D and figure group 414D at the third virtual hierarchy. A figure group 406D at the second virtual hierarchy may be created for these two figure groups 412D and 414D. Similarly, figure group 406D may be optionally created at the first virtual hierarchy.

The aforementioned example illustrates the creation of two clones for figure group 410D and figure group 404D although these two clones are located at two different virtual hierarchies. In addition or in the alternative, a second clone grouping may be created for figure groups 412D, and a third clone grouping may be created for figure groups 414D so that any modifications to one of these clones will be automatically populated to the other clones in the same clone grouping.

Once one or more of these figure groups become sufficiently stable (e.g., after performing placement for these one or more figure groups), these one or more figure groups may be materialized into respective materialized cells or blocks, and the corresponding virtual hierarchies will also be materialized into physical hierarchies. For example, a placement tool may be invoked to place the shapes in figure group 414D for which clones have been identified. Figure group 414D may then be materialized into a materialized block, and the virtual hierarchies (e.g., the second virtual hierarchy for figure group 414D in figure groups 406D and the third virtual hierarchy for figure groups 414D in figure group 408D) may also be materialized into physical hierarchies. In the aforementioned example, the originally flat layout portion 400D now includes the physical hierarchies for the second and third virtual hierarchies, the first virtual hierarchy, and the fourth virtual hierarchy.

Figure 5:
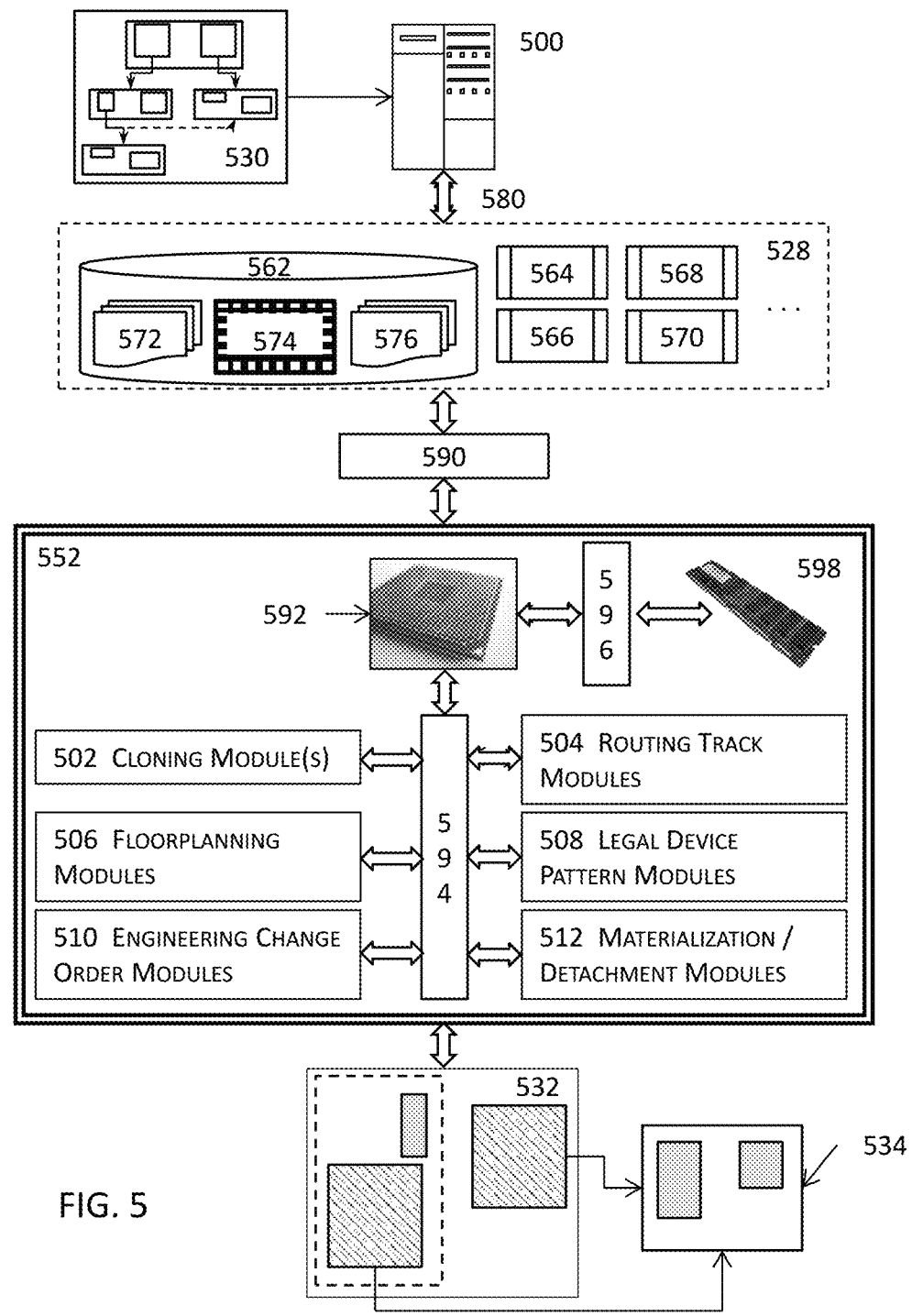
FIG. 5 illustrates another high level block diagram of a simplified system for implementing clones for an electronic design in one or more embodiments.

FIG. 5 illustrates a high level block diagram of a system for implementing clones for an electronic design in one or more embodiments. In these one or more embodiments, the hardware system in FIG. 5 may comprise one or more computing systems 500, such as one or more general purpose computers described in the System Architecture Overview section to implement one or more special proposes. The illustrative system in FIG. 5 may include an Internet-based computing platform providing a shared pool of configurable computer processing resources (e.g., computer networks, servers, storage, applications, services, etc.) and data to other computers and devices in an ubiquitous, on-demand basis via the Internet. For example, one or more computing resources and/or modules illustrated in FIG. 5 may be located in a cloud computing platform in some embodiments.

In some embodiments, the one or more computing systems 500 may invoke various system resources such as the processor(s) or processor core(s), memory, disks, etc. and receive a schematic design 530 and a layout 532 of an electronic design. A cloning module 502 may by itself or in tandem with one or more other modules identify or create clones in the layout 532 that may be optionally materialized into a physical block or cell 534. The one or more computing systems 500 may also initiate or interact with other computing systems to access, via a computer bus architecture (e.g., a system bus, a control bus, a data bus, or any combinations thereof), various resources 528 that may comprise a floorplanner, a placement module, a global routing module, and/or a detail routing module 564, a layout editor 566, a design rule checker 568, a verification engine 570, etc.

The one or more computing systems 500 may further write to and read from a local or remote non-transitory computer accessible storage 562 that stores thereupon data or information such as, but not limited to, one or more databases (574) such as schematic design database(s) or physical design database(s), electronic circuit design specification database(s), various statistics, various data, rule decks, various design rules, constraints, etc. (572), or other information or data (576) that may be used to facilitate the performance of various functions to achieve the intended purposes.

The one or more databases 574 may further include a plurality of cells, blocks, or modules (collectively a cell for singular and cells for plural). Cells may include, for example, one or more standard cells, one or more library cells, one or more memory cells, one or more macro cells, or any combinations thereof. A cell may be an object of a class in the paradigm of object oriented programming and may thus be instantiated into multiple instances to create at least a portion of a hierarchical physical design (e.g., a floorplan, a layout, etc.) or to create a larger and/or more complex cell in some embodiments. In the real hierarchy structure of a hierarchical physical design, certain cells may be situated at the lowest hierarchical level and do not contain any lower hierarchies.

In some embodiments, the one or more computing systems 500 may include or, either directly or indirectly through the various resources 528, invoke a set of mechanisms or modules 552 including hardware and software modules or combinations of one or more hardware and one or more software modules that are stored at least partially in computer memory may comprises one or more cloning modules 502 to identify and/or create clones. The set of modules 552 may further include one or more routing track modules 504 to manage and determine routing tracks that may be inherited by various figure groups at one or more virtual hierarchies without causing any violations of rules for routing track assignments, routing track coloring, etc.

The set of modules 552 may further optionally include one or more floorplanning modules 506 to perform design planning or floorplanning to create a floorplan Constraints, design rules, and requirements are collectively referred to as a design rule for singular or design rules for plural. In addition or in the alternative, the set of modules 552 may further include one or more legal device pattern modules 508 to identify and/or create legal device patterns into one or more figure groups so that all the pertinent rules or requirements will be automatically complied with so long as the arrangements in these legal device patters are observed.

In some embodiments, the set of modules 552 may further include one or more engineering change order (ECO) modules 510 to function in tandem with figure groups and virtual hierarchies to implement engineering change orders. The set of modules 552 may also include a detachment or materialization module 512 to materialize a figure group into a physical block and to materialize a virtual hierarchy into a physical hierarchy and update the physical hierarchical structure of a layout accordingly. Any of these modules described may be stored at least partially in memory and include or function in tandem with one or more microprocessors or one or more processor cores to perform respective functions described herein.

The set of modules 552 may further optionally include one or more signoff modules (not shown) to perform various signoff and design closure tasks to ensure that the electronic design implemented by various techniques described herein may be successfully fabricated while maintaining various performance, cost, reliability, and manufacturability requirements.

For example, the one or more signoff modules may include one or more timing signoff modules to perform timing analyses and timing closure related tasks (e.g., silicon-accurate timing signoff, signal integrity analyses, etc.) to ensure an electronic design meets power, performance, or other requirements before tapeout, one or more signoff parasitic extraction modules to provide silicon-accurate interconnect parasitic extraction and ensure first-pass silicon success, and one or more power signoff modules to perform various power integrity analyses, transistor-level electromigration and IR-drop analyses, or other power and signal integrity analyses with SPICE-level accuracy or better accuracy with SPICE or SPICE-like simulations (e.g., Fast-SPICE, HSPICE, PSPICE, or any other SPICE-based or SPICE-compatible simulations) to ensure an electronic design meets or exceeds power, performance, and/or area goals in some embodiments.

The one or more signoff modules may include one or more physical verification modules (not shown) to perform various design rule checking, layout vs. schematic (LVS), etc. tasks to ensure that an electronic design meets or exceeds various spatial and other physical rules and one or more design for manufacturing (DFM) modules to address physical signoff and electrical variability optimization, correct lithography hotspots, predict silicon contours, improve yield, detect and repair timing and leakage hotspots to achieve variation- and manufacturing-aware signoff and design closure in some of these embodiments.

In addition or in the alternative, the one or more signoff modules may include one or more one or more computational lithography modules (not shown) to provide more accurate post-etch critical dimension accuracy and process windows on silicon, reticle and wafer synthesis, etc. to eliminate errors and/or reduce mask-manufacturing cycle times. One or more of these signoff modules may operate on the electronic design produced or modified with various techniques to be described in the following sections for proper signoff and design closure so that the signoff version of the electronic design may be properly manufactured with first-pass or fewer passes silicon success in some embodiments. In these embodiments, the signoff version of the electronic design produced or modified with various techniques described herein causes the underlying electronic circuit to be manufactured by a foundry or IC (integrated circuit) fabrication facility when the signoff version of the electronic design is forwarded to the foundry or IC (integrated circuits) fabrication facility that in turn fabricates the requisite photomasks and the eventual electronic circuit.

In some embodiments, the computing system 500 may include the various resources 528 such that these various resources may be invoked from within the computing system via a computer bus 580 (e.g., a data bus interfacing a microprocessor 592 and the non-transitory computer accessible storage medium 598 or a system bus 590 between a microprocessor 592 and one or more engines in the various resources 528). In some other embodiments, some or all of these various resources may be located remotely from the computing system 500 such that the computing system may access the some or all of these resources via a computer bus 580 and one or more network components.

The computing system may also include one or more modules in the set of modules 552. One or more modules in the set 552 may include or at least function in tandem with a microprocessor 592 via a computer bus 594 in some embodiments. In these embodiments, a single microprocessor 592 may be included in and thus shared among more than one module even when the computing system 500 includes only one microprocessor 592. A microprocessor 592 may further access some non-transitory memory 598 (e.g., random access memory or RAM) via a system bus 596 to read and/or write data during the microprocessor's execution of processes.

In various embodiments described herein, a synchronous clone or simply a clone may include or correspond to a data structure such as a collection of figures that may be used by electronic design automation (EDA) tools to hold a set of physical circuit component designs that may be replicated and reused. It shall be noted that although some embodiments create synchronous clones by binding physical circuit component designs with corresponding schematic instances at the time the physical circuit component designs are being generated or populated into the layout (and hence "synchronous"), the terms "synchronous clone" and "clone" are used interchangeably throughout the entire description.

The set of physical circuit component designs may represent the locations and geometries of corresponding shapes in an electronic design. This set of physical circuit component designs may be referred to as a figure group, a virtual block, or a logic block (collectively figure group) for simplicity. In various embodiments, a figure group is created at a virtual hierarchy, rather than a physical hierarchy. In these embodiments, the virtual hierarchy does not alter the original physical hierarchical structure of the underlying electronic design. Rather, the information about the virtual hierarchy may be used to annotate the physical hierarchy (e.g., a multi-level physical hierarchical structure or a flat or single-level physical hierarchical structure) and the corresponding schematic hierarchy.

A figure group may be created by identifying a plurality of physical circuit component designs in a flat or a hierarchical layout of an IC (integrated circuit) and by creating a boundary or a bounding box enclosing the plurality of identified physical circuit component designs. The boundary or bounding box may be created to be the minimum rectangular box enclosing the plurality of device designs in some embodiments. In some other embodiments, the boundary or bounding box may be created to be the minimum bounding box of the plurality of physical circuit component designs plus an offset to enclose the plurality of physical circuit component designs.

A figure group may be nested within another figure group, and a figure group may also be nested within the same figure group. A figure group may represent a synchronous clone and represent an abstraction of the layout details of the devices within the figure group. An instance in a layout may also be represented as a figure group, and the creation of a synchronous clone may thus include adding a plurality of figure groups representing the instances to a newly created figure group representing the synchronous clone. When multiple instances are determined to belong to a synchronous clone, or when multiple figure groups representing the multiple instances are determined to belong to a newly created figure group representing the synchronous clone, these multiple instances or figure groups are entirely synchronized in that when one change is made to one instance, the same change will be automatically populated in all the remaining instances.

In creating a clone, these techniques described herein may identify a cell or block instance in the schematic design. Because the layout is generated by instantiating instances of the cell or block by binding physical circuit component designs to their corresponding schematic instance(s), a first instance of the cell or block corresponding to a schematic instance may be identified or created in the layout. This first instance may be located in a first hierarchy of the layout and may be associated with one or more hierarchical parameters. Hierarchical parameters may include, for example, a spacing parameter between two immediately adjacent devices in the first instance, a size parameter for a layout device, a multiplication parameter for implementing multiple instances of the same layout devices and interconnecting these multiple instances, any other suitable parameters that may affect arrangements, interconnections, or numbers of one or more layout devices, etc.

A second instance that is bound to the same cell or block instance in the schematic may also be identified or created in the layout by referencing the schematic cell or block instance or the master thereof. The second instance may be located on the same hierarchy or on a different hierarchy from the first instance. In some embodiments where the second instance is also associated with one or more hierarchical parameters having one or more hierarchical parameter values.

These techniques may determine whether the first instance and the second instance have identical topology and one or more identical parameter values. In some embodiments where these two instances are instantiated from or bound to the same schematic cell or block instance, the topology of these two instances may be automatically assumed to be identical although one or more of their hierarchical parameters may correspond to one or more different values. In some embodiments, these techniques may nevertheless compare the respective topology of the first and the second instance to determine whether their topology is identical.

If the topology and the corresponding hierarchical parameter values of the first and second instance are identical, these techniques may categorize both instances as clones, and the first and second instances may be denoted as a clone of each other such that when one instance is modified, the same modifications are automatically propagated to the other instance.

On the other hand, if the second instance has the same topology as the first instance but includes or corresponds to a different hierarchical parameter value (e.g., a hierarchical parameter value of "2") of the same hierarchical parameter, the second instance and the first instance may not be categorized clones in some embodiments. In some other embodiments, these techniques may optionally determine whether a hierarchical parameter may be relaxed so that the discrepancies in the parameter values may be ignored in the determination of clones. This determination of whether a hierarchical parameter may be relaxed may be predetermined or may be made on the fly when two parameter values of a hierarchical parameter are different. If the determination is affirmative, the first and second instances may nevertheless be assigned to a synchronous clone despite the differences in their respective parameter values of the same hierarchical parameter. Otherwise, these two instances may not be categorized as clones. Because a figure group may be created for a layout device comprising one or more layout component designs, clones in a layout may be represented in an abstract manner as multiple instances of the same figure group.

These techniques may then proceed through the remaining instances instantiated from the same schematic cell or block and similarly determine whether each instance of the remaining instances is to be assigned to the synchronous clone. That is, these techniques may proceed through all the instances instantiated from the same schematic cell or block instance and categorize the layout instances having identical topology and one or more hierarchical parameter values as clones in some embodiments. The information about a synchronous clone group having multiple clones in a layout may be stored with a clone identification in a data structure. The identifications or references of layout instances that are clones of each other (and hence belong to this synchronous clone group) may also be stored in the data structure. In some embodiments, information about the schematic instance or schematic master cell bound to these multiple instances of layout devices may also be stored in the data structure.

In some embodiments where a new layout instance corresponding to the same schematic instance (or schematic master cell) and same hierarchical parameter values is to be inserted into the layout, an instance of the clone or a figure group may be inserted while the figure group may further provides logic pins or even physical terminals along the boundary of the figure group so that the figure group may be interconnected with the rest of the electronic design.

In some embodiments where an instance may correspond to multiple hierarchical parameters and hence multiple corresponding hierarchical parameter values, these techniques may determine whether one or more of these multiple hierarchical parameters may be relaxed. As similarly described above, this determination of whether a hierarchical parameter may be relaxed may be predetermined or may be made on the fly when two values of a hierarchical parameter are different. If it is determined that a hierarchical parameter may be relaxed, these techniques may assign two instances into a synchronous clone by examining only the topology of these two instances but not their hierarchical parameter values. In these embodiments, these two instances may be categorized as clones when the topology and one or more of these multiple hierarchical parameter values are identical, regardless of whether the corresponding hierarchical values of one or more hierarchical parameters, which may be relaxed, may differ.

In some embodiments, an instance at a certain hierarchy may not necessarily be associated with a hierarchical parameter, but one of its parent cells at a higher hierarchy may be associated with a hierarchical parameter that may affect whether this instance and another instance may be categorized as a clone. For example, a parent cell of a layout instance may correspond to or include a hierarchical parameter that will be inherited by and thus affect the instantiation of the layout instance. In these embodiments, these techniques may traverse the hierarchical structure of the electronic design from the current virtual or physical hierarchy and proceed to each parent cell at a higher hierarchy to determine whether such one or more hierarchical parameters exist until some or all pertinent hierarchical parameters and their corresponding values have been identified for comparison or until a stop criterion has been reached (e.g., search N-levels above the current virtual or physical hierarchies).

In the above example where the first instance and a second instance instantiated from the same schematic cell or block are not categorized as clones either because of different topologies, different hierarchical parameter values of the same hierarchical parameter, or different topology and different hierarchical parameter values. In these embodiments, neither instance will be discarded from further analysis or processing and will be maintained as two separate instances (or figure groups) subject to separate and independent manipulations and modifications. Furthermore, the second instance may be left for subsequent analyses where any instances that are instantiated from the same schematic cell or block and are not a synchronous clone of the first instance will be analyzed with respect to the second instance to determine whether these instance and the second instance may be assigned to a different synchronous clone. In these embodiments, a schematic cell or block instance may be bound to multiple synchronous clones (one being based on the first instance, and the other being based on the second instance in this example).

SYSTEM ARCHITECTURE OVERVIEW

Figure 6:
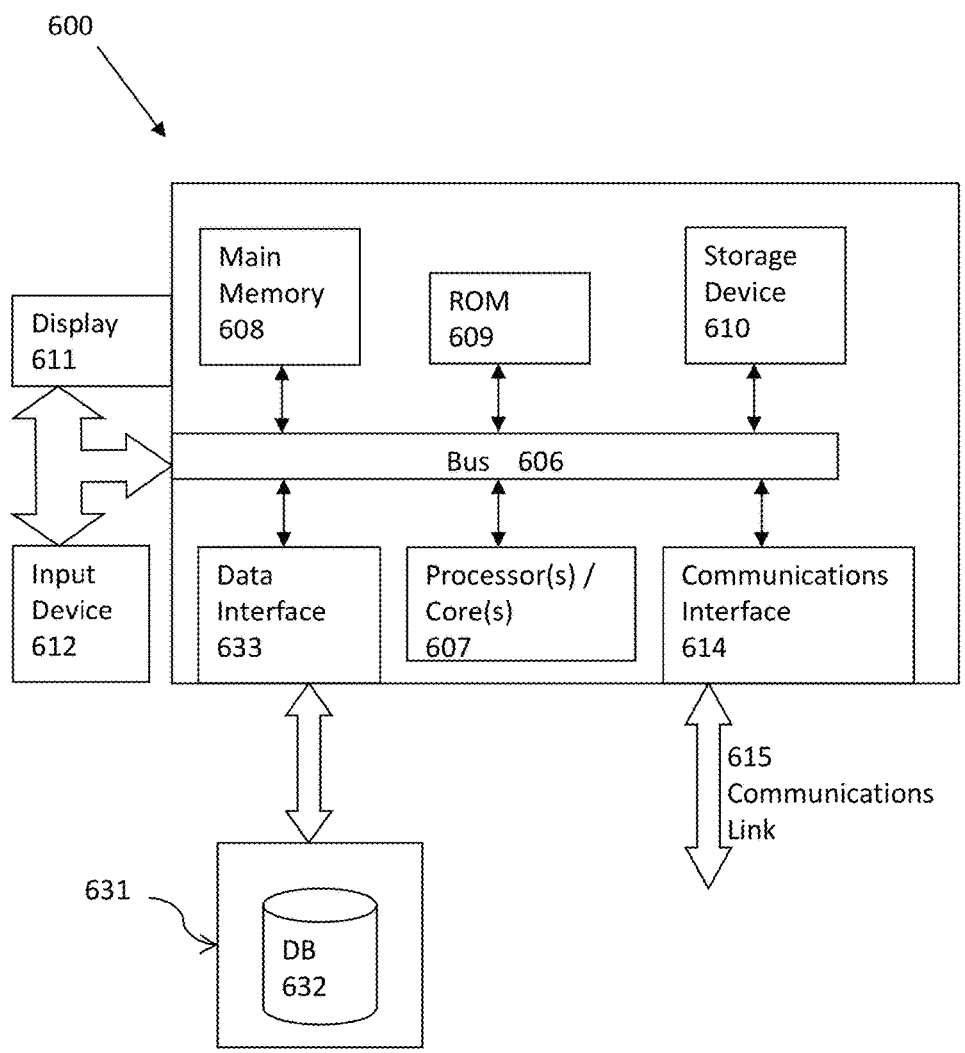
FIG. 6 illustrates a computerized system on which a method for implementing clones for an electronic design may be implemented.

FIG. 6 illustrates a computerized system on which a method for implementing clones for an electronic design may be implemented. Computer system 600 includes a bus 606 or other communication module for communicating information, which interconnects subsystems and devices, such as processor 607, system memory 608 (e.g., RAM), static storage device 609 (e.g., ROM), disk drive 610 (e.g., magnetic or optical), communication interface 614 (e.g., modem or Ethernet card), display 611 (e.g., CRT or LCD), input device 612 (e.g., keyboard), and cursor control (not shown). The illustrative computing system 600 may include an Internet-based computing platform providing a shared pool of configurable computer processing resources (e.g., computer networks, servers, storage, applications, services, etc.) and data to other computers and devices in an ubiquitous, on-demand basis via the Internet. For example, the computing system 600 may include or may be a part of a cloud computing platform in some embodiments.

According to one embodiment, computer system 600 performs specific operations by one or more processor or processor cores 607 executing one or more sequences of one or more instructions contained in system memory 608. Such instructions may be read into system memory 608 from another computer readable/usable storage medium, such as static storage device 609 or disk drive 610. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 607, where the one or more processors, one or more processor cores, or combination thereof executes one or more threads. For example, the acts of determination, extraction, stitching, simulating, annotating, analyzing, optimizing, and/or identifying, etc. may be performed by one or more processors, one or more processor cores, or combination thereof. In one embodiment, the parasitic extraction, current solving, current density computation and current or current density verification is done in memory as layout objects or nets are created or modified.

The term "computer readable storage medium" or "computer usable storage medium" as used herein refers to any non-transitory medium that participates in providing instructions to processor 607 for execution. Such a medium may take many forms, including but not limited to, non-volatile media and volatile media. Non-volatile media includes, for example, optical or magnetic disks, such as disk drive 610. Volatile media includes dynamic memory, such as system memory 608. Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 600. According to other embodiments of the invention, two or more computer systems 600 coupled by communication link 615 (e.g., LAN, PTSN, or wireless network) may perform the sequence of instructions required to practice the invention in coordination with one another.

Computer system 600 may transmit and receive messages, data, and instructions, including program (e.g., application code) through communication link 615 and communication interface 614. Received program code may be executed by processor 607 as it is received, and/or stored in disk drive 610, or other non-volatile storage for later execution. In an embodiment, the computer system 600 operates in conjunction with a data storage system 631, e.g., a data storage system 631 that includes a database 632 that is readily accessible by the computer system 600. The computer system 600 communicates with the data storage system 631 through a data interface 633. A data interface 633, which is coupled to the bus 606 (e.g., memory bus, system bus, data bus, etc.), transmits and receives electrical, electromagnetic or optical signals that include data streams representing various types of signal information, e.g., instructions, messages and data. In embodiments of the invention, the functions of the data interface 633 may be performed by the communication interface 614.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

I claim:

1. A computer-implemented method for implementing clones for an electronic design, the computer implemented method comprising:
    identifying a schematic design of an electronic design;
    identifying a set of cloning rules, configurations, or settings; and
    generating a plurality of synchronous clones of a cloning source device for a plurality of layout circuit component designs in a layout of the electronic design based in part or in whole upon the set of cloning rules, configurations, or settings, without parsing the electronic design or a portion thereof to determine whether the plurality of layout circuit component designs match the cloning source device.

2. The computer-implemented method of claim 1, further comprising:
    identifying a schematic circuit component design from the schematic design corresponding to the layout of the electronic design;
    identifying schematic hierarchy information of the schematic circuit component design in the schematic design; and
    determining whether the layout includes the plurality of layout circuit component designs bound to the schematic circuit component design.

3. The computer-implemented method of claim 2, further comprising:
    updating a synchronous clone data structure with first information about the plurality of layout circuit component designs, second information about the schematic hierarchy, or third information about the schematic circuit component design.

4. The computer-implemented method of claim 2, further comprising at least one of:
    creating a figure group for a synchronous clone for a layout circuit component design of the plurality of layout circuit component designs;
    placing a plurality of geometric shapes in the figure group;
    materializing the figure group comprising the plurality of geometric shapes that have been placed into a materialized cell or a materialized block;
    materializing a virtual hierarchy at which the figure group is located into a physical hierarchy;
    updating a physical hierarchical structure of the layout with at least the physical hierarchy corresponding to the virtual hierarchy; or
    performing routing within the materialized cell or the materialized block or between two materialized cells, between two materialized blocks, or between the materialized cell and the materialized block.

5. The computer-implemented method of claim 2, further comprising:
    determining whether synchronous clones are to be created for two or more layout circuit component designs of the plurality of layout circuit component designs.

6. The computer-implemented method of claim 5, wherein the act of determining whether the synchronous clones are to be created further comprising:
    identifying first layout instances corresponding to the schematic circuit component design; and
    determining whether at least two first layout instances of the first layout instances correspond to a same topology.

7. The computer-implemented method of claim 6, wherein the act of determining whether the synchronous clones are to be created further comprising:
    determining whether the layout is a hierarchical layout including two or more physical hierarchies when at least two first layout instances of the first layout instances are determined to correspond to a same topology.

8. The computer-implemented method of claim 7, wherein the act of determining whether the synchronous clones are to be created further comprising:
    identifying a lowest hierarchy from the two or more physical hierarchies at which the at least two first layout instances are located when the layout is determined to be the hierarchical layout; and
    traversing one or more parent layout circuit component designs at one or more parent physical hierarchies of the lowest hierarchy when the layout is determined to be the hierarchical layout.

9. The computer-implemented method of claim 7, wherein the act of determining whether the synchronous clones are to be created further comprising:
    identifying one or more common hierarchical parameters included in or corresponding to the at least two first layout instances;
    determining whether at least one common hierarchical parameter of the one or more common hierarchical parameters is relaxable; and
    reducing a search space for determining whether the synchronous clones are to be created at least by discarding the at least one common hierarchical parameter in determining whether the synchronous clones are to be created.

10. The computer-implemented method of claim 9, wherein the act of determining whether the synchronous clones are to be created further comprising:

determining whether parameter values of the at least one common hierarchical parameter for the at least two first layout instances are identical; and generating at least two synchronous clones based in part or in whole upon whether the parameter values are identical.

11. A system for implementing clones for an electronic design, the system comprising:

non-transitory computer accessible storage medium storing thereupon program code;

at least one processor executing the program code to identify a schematic design of an electronic design; and one or more modules that are stored at least partially in memory of one or more computing systems, that include or function in conjunction with at least one hardware processor of the one or more computing systems, and that are configured to execute the program code to identify a set of cloning rules, configurations, or settings, wherein the at least one processor further executing the program code to generate a plurality of synchronous clones of a cloning source device for a plurality of layout circuit component designs in a layout of the electronic design based in part or in whole upon the set of cloning rules, configurations, or settings, without parsing the electronic design or a portion thereof to determine whether the plurality of layout circuit component designs match the cloning source device.

12. The system for claim 11, wherein the at least one processor further executes the program code to identify a schematic circuit component design from the schematic design corresponding to the layout of the electronic design, to identify schematic hierarchy information of the schematic circuit component design in the schematic design, and to determine whether the layout includes a plurality of layout circuit component designs bound to the schematic circuit component design.

13. The system for claim 12, wherein the at least one processor further executes the program code to update a synchronous clone data structure with first information about the plurality of layout circuit component designs, second information about the schematic hierarchy, or third information about the schematic circuit component design.

14. The system for claim 12, wherein the at least one processor further executes the program code at least to create a figure group for a synchronous clone for a layout circuit component design of the plurality of layout circuit component designs, to place a plurality of geometric shapes in the figure group, to materialize the figure group comprising the plurality of geometric shapes that have been placed into a materialized cell or a materialized block, to materialize a virtual hierarchy at which the figure group is located into a physical hierarchy, to update a physical hierarchical structure of the layout with at least the physical hierarchy corresponding to the virtual hierarchy, or to perform routing within the materialized cell or the materialized block or between two materialized cells, between the two materialized blocks, or between the materialized cell and the materialized block.

15. The system for claim 12, wherein the at least one processor further executes the program code to determine whether synchronous clones are to be created for two or more layout circuit component designs of the plurality of layout circuit component designs, to identify first layout instances corresponding to the schematic circuit component design, and to determine whether at least two first layout instances of the first layout instances correspond to a same topology.

16. An article of manufacture comprising a non-transitory computer accessible storage medium having stored thereupon a sequence of instructions which, when executed by at least one processor or at least one processor core executing one or more threads, causes the at least one processor or the at least one processor core to perform a set of acts for implementing clones for an electronic design, the set of acts comprising:

identifying a schematic design of an electronic design;

identifying a set of cloning rules, configurations, or settings;

generating a plurality of synchronous clones of a cloning source device for a plurality of layout circuit component designs in a layout of the electronic design based in part or in whole upon the set of cloning rules, configurations, or settings, without parsing the electronic design or a portion thereof to determine whether the plurality of layout circuit component designs match the cloning source device.

17. The article of manufacture of claim 16, wherein the set of acts further comprises:

identifying a schematic circuit component design from the schematic design corresponding to the layout of the electronic design;

identifying schematic hierarchy information of the schematic circuit component design in the schematic design; and determining whether the layout includes a plurality of layout circuit component designs bound to the schematic circuit component design.

18. The article of manufacture of claim 17, wherein the set of acts further comprises:

determining whether synchronous clones are to be created for two or more layout circuit component designs of the plurality of layout circuit component designs;

identifying first layout instances corresponding to the schematic circuit component design; and determining whether at least two first layout instances of the first layout instances correspond to a same topology.

19. The article of manufacture of claim 18, wherein the set of acts further comprises:

identifying one or more common hierarchical parameters included in or corresponding to the at least two first layout instances;

determining whether at least one common hierarchical parameter of the one or more common hierarchical parameters is relaxable; and reducing a search space for determining whether the synchronous clones are to be created at least by discarding the at least one common hierarchical parameter in determining whether the synchronous clones are to be created.

20. The article of manufacture of claim 19, wherein the set of acts further comprises:

determining whether parameter values of the at least one common hierarchical parameter for the at least two first layout instances are identical; and generating at least two synchronous clones based in part or in whole upon whether the parameter values are identical.

* * * * *